(12) United States Patent
Isa et al.

(10) Patent No.: US 10,254,796 B2
(45) Date of Patent: Apr. 9, 2019

(54) INFORMATION PROCESSING DEVICE, DISPLAY DEVICE, AND ELECTRONIC DEVICE

(71) Applicant: Semiconductor Energy Laboratory Co., Ltd., Kanagawa-ken (JP)

(72) Inventors: Toshiyuki Isa, Kanagawa (JP); Akio Endo, Kanagawa (JP); Yosuke Tsukamoto, Kanagawa (JP); Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/497,743

(22) Filed: Apr. 26, 2017

(65) Prior Publication Data
US 2017/0315589 A1  Nov. 2, 2017

(30) Foreign Application Priority Data

Apr. 28, 2016 (JP) .................................. 2016-090875

(51) Int. Cl.
| | |
|---|---|
| G06F 1/16 | (2006.01) |
| G06F 3/041 | (2006.01) |
| G06F 3/042 | (2006.01) |
| G06F 3/044 | (2006.01) |
| H01L 27/32 | (2006.01) |

(52) U.S. Cl.
CPC .......... *G06F 1/1652* (2013.01); *G06F 1/1616* (2013.01); *G06F 1/1618* (2013.01); *G06F 1/1641* (2013.01); *G06F 1/1675* (2013.01); *G06F 3/042* (2013.01); *G06F 3/0412* (2013.01); *G06F 3/044* (2013.01); *G06F 3/0416* (2013.01); *G06F 2203/04102* (2013.01); *G06F 2203/04103* (2013.01); *G06F 2203/04111* (2013.01); *H01L 27/323* (2013.01)

(58) Field of Classification Search
CPC ....... G06F 1/1652; G06F 3/0416; G06F 3/044
See application file for complete search history.

(56) References Cited

U.S. PATENT DOCUMENTS

| | | | |
|---|---|---|---|
| 9,088,006 B2* | 7/2015 | Yamazaki | ........... H01L 51/5246 |
| 9,395,070 B2 | 7/2016 | Endo | |
| 9,582,043 B2* | 2/2017 | Hirakata | ............... G06F 1/1652 |
| 9,857,844 B2* | 1/2018 | Tsukamoto | ........... G06F 1/1652 |

(Continued)

FOREIGN PATENT DOCUMENTS

| | | |
|---|---|---|
| JP | 2014-197522 A | 10/2014 |
| JP | 2015-064570 A | 4/2015 |

*Primary Examiner* — Hoa C Nguyen
*Assistant Examiner* — Keith DePew
(74) *Attorney, Agent, or Firm* — Husch Blackwell LLP

(57) ABSTRACT

An electronic device with a large display region and improved portability is provided. An electronic device with improved reliability is provided. The information processing device includes a first film, a second film, a panel substrate, and at least a first housing. The panel substrate has flexibility and includes a display region. The first film has visible light transmittance and flexibility, and the second film has flexibility. The first housing includes a first slit, the panel substrate includes a region interposed between the first film and the second film, the first slit is configured to store the region, and one or more of the panel substrate, the first film, and the second film can slide along the first slit.

17 Claims, 11 Drawing Sheets

(56) References Cited

U.S. PATENT DOCUMENTS

| | | | |
|---|---|---|---|
| 2015/0009128 A1 | 1/2015 | Matsumoto | |
| 2015/0014681 A1 | 1/2015 | Yamazaki | |
| 2015/0016126 A1* | 1/2015 | Hirakata | F21V 15/012 |
| | | | 362/418 |
| 2015/0023030 A1* | 1/2015 | Tsukamoto | G06F 1/1652 |
| | | | 362/419 |
| 2015/0062525 A1* | 3/2015 | Hirakata | G02F 1/133305 |
| | | | 349/158 |
| 2017/0139442 A1 | 5/2017 | Yoshizumi | |

* cited by examiner

INFORMATION PROCESSING DEVICE, DISPLAY DEVICE, AND ELECTRONIC DEVICE

BACKGROUND OF THE INVENTION

1. Field of the Invention

One embodiment of the present invention relates to an information processing device, a display device, and an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

Electronic devices including display devices have recently been diversified. An example of the electronic devices is an information processing device such as a cellular phone, a smartphone, a tablet terminal, and a wearable terminal.

Examples of the display devices include, typically, a light-emitting device including a light-emitting element such as an organic electroluminescent (EL) element or a light-emitting diode (LED), a liquid crystal display device, and an electronic paper performing display by an electrophoretic method or the like. Patent Documents 1 and 2 each disclose a flexible light-emitting device using an organic EL element.

REFERENCE

Patent Document

[Patent Document 1] Japanese Published Patent Application No. 2014-197522
[Patent Document 2] Japanese Published Patent Application No. 2015-064570

SUMMARY OF THE INVENTION

In recent years, information processing devices, display devices, and electronic devices have been particularly required to have large display regions. A large display region offers advantages such as improved browsability and increased amount of information that can be displayed. However, in portable electronic devices, an enlargement of display regions causes a reduction in portability. For this reason, browsability of display and portability are difficult to improve at the same time.

An object of one embodiment of the present invention is to provide an electronic device with a large display region. Another object is to improve the portability of an electronic device. Another object is to improve both browsability of display and portability. Another object is to provide a novel electronic device. Another object is to improve the reliability of an electronic device.

Note that the description of these objects does not preclude the existence of other objects. In one embodiment of the present invention, there is no need to achieve all the objects. Other objects will be apparent from and can be derived from the description of the specification, the drawings, the claims, and the like.

An information processing device of one embodiment of the present invention includes a first film, a second film, a panel substrate, and a first housing. The first housing includes a first slit, the panel substrate includes a region interposed between the first film and the second film, the first slit is configured to store the region, and one or more of the panel substrate, the first film, and the second film can slide along the first slit.

An information processing device of one embodiment of the present invention includes a first housing, a second housing, a third housing, a first hinge, a second hinge, a first slit, a second slit, a third slit, a panel substrate, a first film, and a second film. The first hinge has a first axis, the second hinge has a second axis, the second axis is arranged parallel to the first axis, the second housing is connected to the first housing through the first hinge so as to be rotatable around the first axis, and the third housing is connected to the second housing through the second hinge so as to be rotatable around the second axis. The first housing includes a first slit, the second housing includes a second slit, the third housing includes a third slit, the panel substrate includes a region interposed between the first film and the second film, and one or more of the first slit, the second slit, and the third slit is configured to store the region. One or more of the panel substrate, the first film, and the second film can slide along the third slit.

In each of the above structures, preferably, the panel substrate has flexibility and includes a display region, the second film includes a region interposed between the display region and the first housing, the first film has visible light transmittance and flexibility, and the second film has flexibility.

In each of the above structures, preferably, the first film is fixed to part of the first housing, and the first film, the second film, and the panel substrate can slide along the second slit and the third slit when the first housing and the second housing rotate around the first axis.

In each of the above structures, preferably, the first film is fixed to the first housing, the first film can slide along the second slit and the third slit when the first housing and the second housing rotate around the first axis, and the second film is fixed to the first housing, the second housing, and the third housing.

In each of the above structures, preferably, the third housing has an end portion parallel to the second hinge, and the distance between the first film and the end portion, the distance between the second film and the end portion, and the distance between the panel substrate and the end portion are each greater than 0 when each of the first film, the second film, and the panel substrate slides in the third slit.

In each of the above structures, preferably, a circuit board is provided and the circuit board is connected to the panel substrate and stored in the first housing.

In each of the above structures, preferably, at least one driver circuit is provided in a region over the panel substrate by a COG method, a curved portion is provided between the display region and the region provided by the COG method, and the panel substrate is folded at the curved portion. In each of the above structures, preferably, the panel substrate includes an image signal line driver circuit, a curved portion is provided between the image signal line driver circuit and the display region, and the panel substrate is folded at the curved portion.

In each of the above structures, preferably, the panel substrate is a touch panel. In each of the above structures, preferably, the panel substrate is a touch panel, and an FPC that transmits or receives a signal for controlling the display region, and an FPC that transmits or receives a signal for controlling the touch panel are stored in the first housing.

According to one embodiment of the present invention, a novel information processing device with high portability and reliability can be provided. A novel information processing device with high operability can be provided. A novel information processing device, a novel display device, or the like can be provided. Note that the description of these effects does not preclude the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1A:
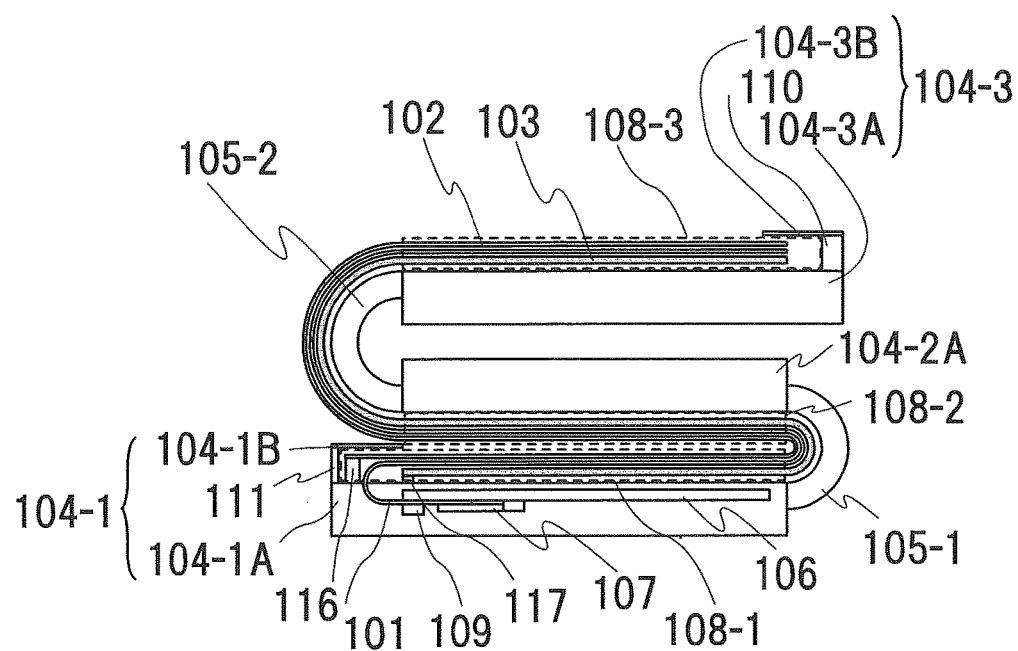
FIGS. 1A and 1B are cross-sectional views of an information processing device of an embodiment.

Embodiments will be described in detail with reference to drawings. Note that the present invention is not limited to the following description, and it is easily understood by those skilled in the art that various changes and modifications can be made without departing from the spirit and scope of the present invention. Accordingly, the present invention should not be interpreted as being limited to the description of the embodiments below. Note that in the structures of the invention described below, the same portions or portions having similar functions are denoted by the same reference numerals in different drawings, and the description of such portions is not repeated.

Embodiment 1

In this embodiment, a foldable touch panel that is included in an information processing device of one embodiment of the present invention will be described with reference to FIG. 1A to FIG. 4. The touch panel includes a display region and a touch sensor.

<Cross-Sectional View>

Figure 1B:
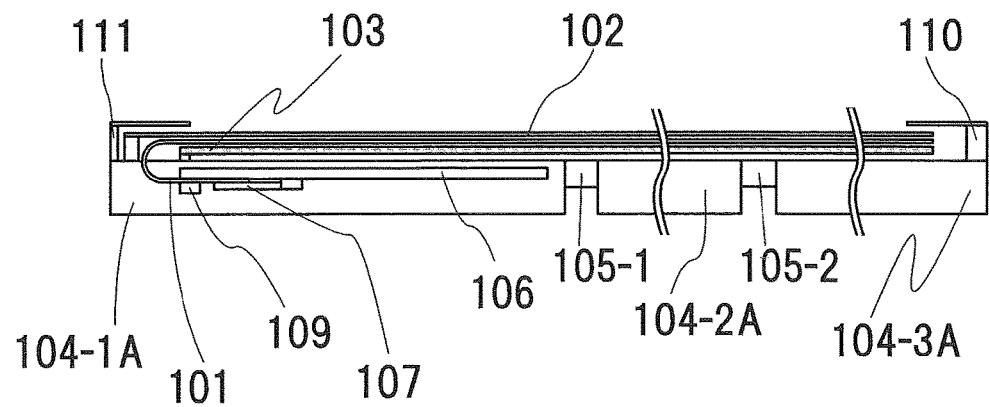

FIG. 1A is a cross-sectional view showing one state of a foldable information processing device of one embodiment of the present invention. FIG. 1B shows another state of the foldable information processing device of one embodiment of the present invention.

In one embodiment of the present invention, the foldable information processing device includes a panel substrate 101, a first film 102, a second film 103, a first housing 104-1, a second housing 104-2 (see FIG. 4), a third housing 104-3, a hinge 105-1, a hinge 105-2, a circuit board 106, and an FPC 107. The panel substrate 101, the first film 102, and the second film 103 each have flexibility. The first housing 104-1, the second housing 104-2, or the third housing 104-3 can rotate around an axis of the hinge 105-1 or an axis of the hinge 105-2. That is, FIG. 1A illustrates the information processing device that is folded around the axis of the hinge 105-1 and the axis of the hinge 105-2.

In FIG. 1A, the first housing 104-1 includes a first part 104-1A, a second part 104-1B, and an end portion 111. The second housing 104-2 includes a first part 104-2A, a second part (not illustrated), and an end portion (not illustrated). The third housing 104-3 includes a first part 104-3A, a second part 104-3B, and an end portion 110. The first part 104-1A, the first part 104-2A, and the first part 104-3A are connected to the hinge 105-1 or the hinge 105-2, and the circuit board 106 and the FPC 107 are stored in the first part 104-1A. The second part 104-1B of the first housing 104-1 is a region that overlaps with the first part 104-1A with a space therebetween. The second part (not illustrated) of the second housing 104-2 is a region that overlaps with the first part 104-2A with a space therebetween. The second part 104-3B of the third housing 104-3 is a region that overlaps with the first part 104-3A with a space therebetween. The end portion 111 is positioned between the first part 104-1A and the second part 104-1B. Also, the end portion 110 is positioned between the first part 104-3A and the second part 104-3B. For example, in the first housing 104-1, the first part 104-1A, the second part 104-1B, and the end portion 111 create a space (a slit). In other words, the foldable information processing device includes a slit 108-1 in the first housing 104-1, a slit 108-2 in the second housing 104-2, and a slit 108-3 in the third housing 104-3.

The first film 102, the panel substrate 101, and the second film 103, which overlap with each other, are stored in a space including the slit 108-1, the slit 108-2, or the slit 108-3.

In the case where a driver circuit is provided on the panel substrate, it may be provided as an in-cell circuit or with a COG method. FIGS. 1A and 1B illustrate a socket 109 that is used in the case where the driver circuit is provided with a COG method.

The information processing device of one embodiment of the present invention includes the panel substrate 101, which can be folded, and the first film 102, which is transparent and has a thickness of 50 µm to 500 µm, preferably 80 µm to 150 µm. The first film 102 prevents mechanical damage on the surface of the panel substrate 101 and prevents the panel substrate 101 from being lifted up from the first housing 104-1, the second housing 104-2, and the third housing 104-3. In addition, the second film 103 is provided between the panel substrate 101 and one of the first housing 104-1, the second housing 104-2, and the third housing 104-3. The panel substrate 101 is interposed between the first film 102 and the second film 103 so as to be slidable, and thus is supported by the first housing 104-1, the second housing 104-2, and the third housing 104-3.

In one embodiment of the present invention, the first film 102 and the second film 103 are fixed to a portion in contact with the first housing 104-1, thereby supported by the first housing 104-1. As illustrated in FIG. 1A, the first film 102 is fixed to the first housing 104-1 with a support 116. The second film 103 is fixed to the first housing 104-1 with a support 117.

In one embodiment of the present invention, the circuit board 106 is connected to the panel substrate 101 through the FPC 107. The circuit board 106 is fixed to the first housing 104-1. The panel substrate 101 is supported by the first housing 104-1 with friction between a folded portion of the panel substrate 101 and the first housing 104-1 in the vicinity of the end portion 111 and with contact with the circuit board 106 in the FPC 107.

In the slit 108-1 of the first housing 104-1, the first film 102 and the panel substrate 101, and the panel substrate 101 and the second film 103 may be fixed to each other. This is because when the information processing device is folded, the panel substrate 101, the first film 102, and the second film 103 slide in the slit 108-2 of the second housing 104-2 and the slit 108-3 of the third housing 104-3, so that damage of the panel substrate due to stress can be prevented.

The first film 102 includes a region that is not to fixed to the panel substrate 101. When the information processing device is folded while the first film 102 is fixed to the panel substrate 101, the panel substrate 101 is prone to fracture due to stress. In one embodiment of the present invention, the first film 102 and the panel substrate 101 slide when the above information processing device is folded, whereby damage on the panel substrate 101 due to stress is reduced.

Figure 2A:
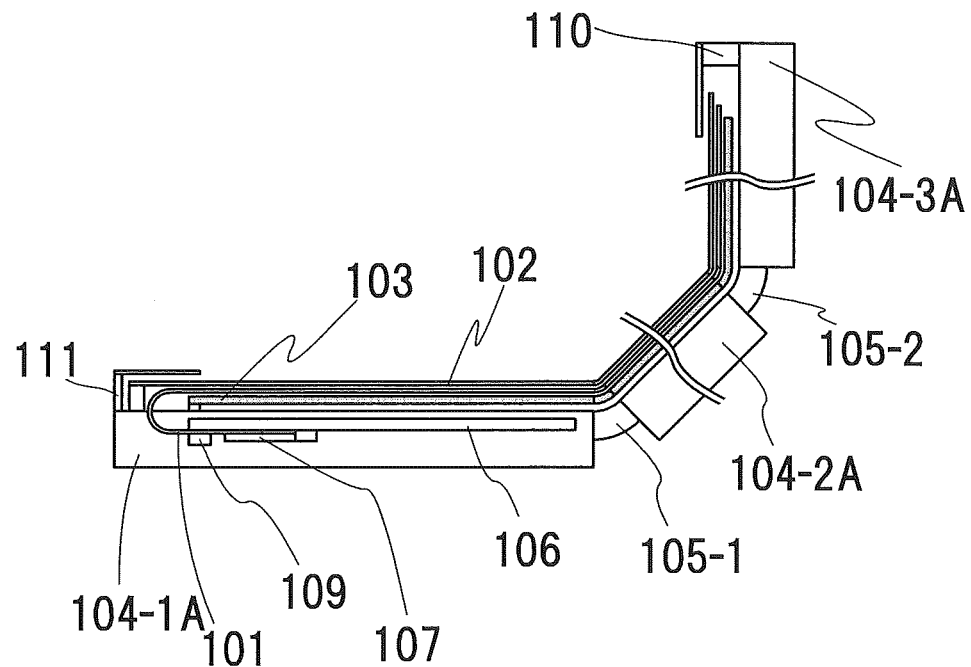
FIGS. 2A and 2B are cross-sectional views of an information processing device of an embodiment.
Figure 2B:
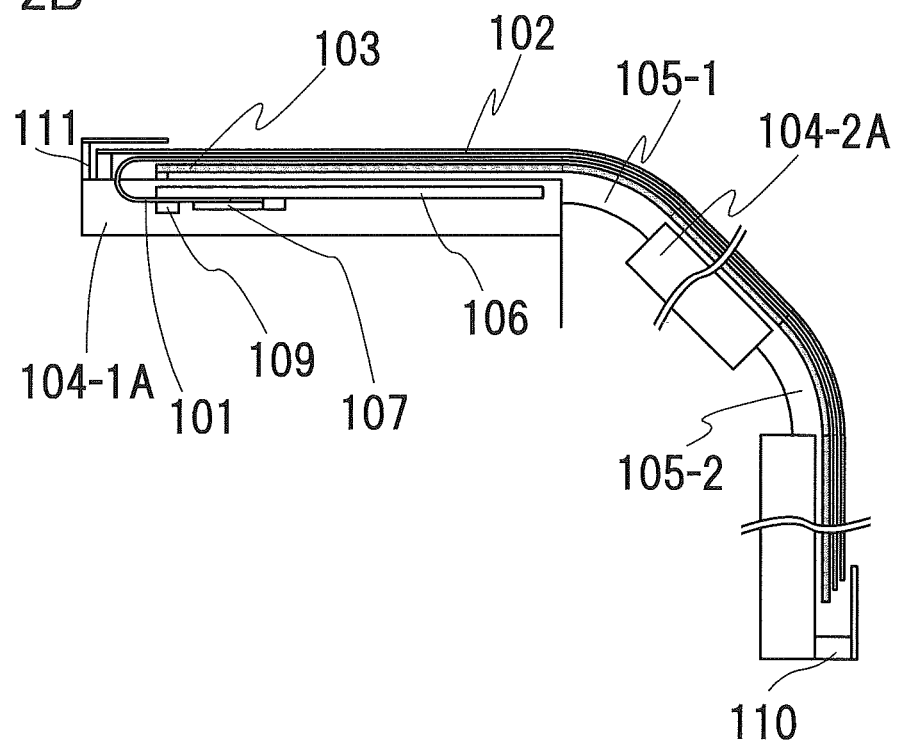

In the information processing device of one embodiment of the present invention, the display region is visible through the first film 102. That is, the first film 102 transmits visible wavelength light. FIG. 2A is the information processing device that is folded so that the display surface has a depression when the display region is seen through the first film 102. In FIG. 2A, the first film 102 is closer to the end portion 110 than the second film 103 is. FIG. 2B is the information processing device that is folded so that the display surface has a projection. In FIG. 2B, the second film 103 is closer to the end portion 110 than the first film 102 is. The first film 102, the second film 103, and the panel substrate 101 slide in this manner; it is thus possible to reduce bending stress, compressive stress, and tensile stress that are applied to the panel substrate 101.

<Top View of Panel Substrate>

Figure 3A:
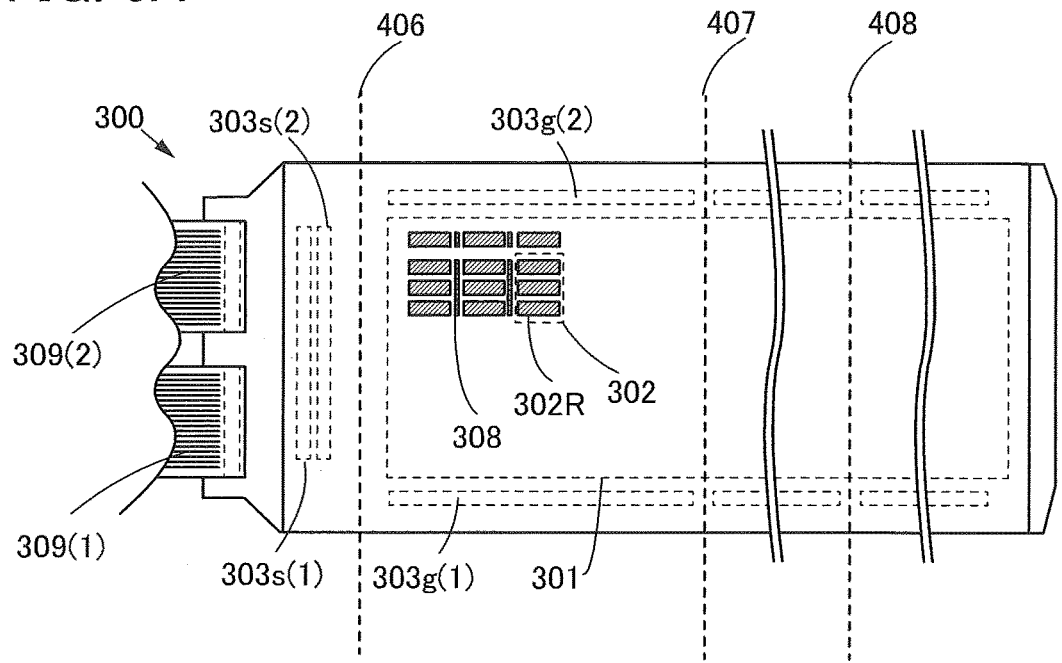
FIGS. 3A and 3B illustrate a structure of a touch panel that can be used in an information processing device of an embodiment.
Figure 3B:
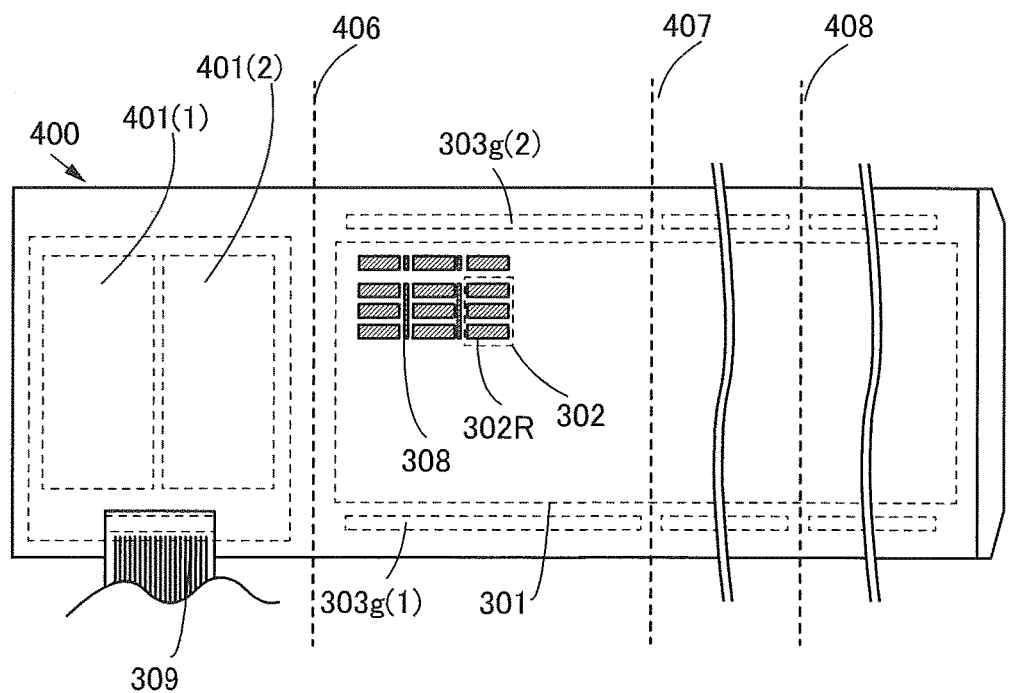

A touch panel 300 and a touch panel 400 are illustrated as examples of the panel substrate 101 in this embodiment (see FIGS. 3A and 3B). The touch panel 300 and the touch panel 400 each include a display portion 301.

The display portion 301 includes a plurality of pixels 302 and a plurality of imaging pixels 308. The imaging pixels 308 can sense a touch of a finger or the like on the display portion 301. Thus, a touch sensor can be formed using the imaging pixels 308.

Each of the pixels 302 includes a plurality of sub-pixels (e.g., a sub-pixel 302R). The sub-pixels include light-emitting elements and pixel circuits that can supply electric power for driving the light-emitting elements.

The pixel circuits are electrically connected to wirings for supplying selection signals and wirings for supplying image signals.

The touch panel 300 illustrated in FIG. 3A includes in-cell circuits: a scan line driver circuit $303g(1)$ that can supply selection signals to the pixels 302 and an image signal line driver circuit $303s(1)$ that can supply image signals to the pixels 302. The touch panel 400 illustrated in FIG. 3B includes a region 401(1) and a region 401(2), in which the socket 109 is arranged in the case where a scan line driver circuit that can supply selection signals to the pixels 302 and an image signal line driver circuit that can supply image signals to the pixels 302 are provided with a COG method.

The imaging pixels 308 include photoelectric conversion elements and imaging pixel circuits that drive the photoelectric conversion elements.

The imaging pixel circuits are electrically connected to wirings for supplying control signals and wirings for supplying power supply potentials.

Examples of the control signals include a signal for selecting an imaging pixel circuit from which a recorded imaging signal is read, a signal for initializing an imaging pixel circuit, and a signal for determining the time for an imaging pixel circuit to sense light.

The touch panels 300 and 400 include an imaging pixel driver circuit $303g(2)$ that can supply control signals to the imaging pixels 308. The touch panel 300 further includes an imaging signal line driver circuit $303s(2)$ that reads out imaging signals.

The touch panels 300 and 400 are each folded in regions around lines 406, 407, and 408. Each of the touch panels 300 and 400, which is folded along the line 406, along the line 407, and along the line 408, is folded in the vicinity of the end portion 111, in the vicinity of the hinge 105-1, and in the vicinity of the hinge 105-2, respectively. When a region where the panel is folded is referred to as a curved portion, the positions of the curved portions including the lines 406 and 407 with respect to the panel substrate are almost unchanged. In contrast, the position of the curved portion including the line 408 with respect to the panel substrate changes with the folding state of the hinge 105-1.

The touch panel 300 is folded between the display region and the region where the image signal line driver circuit $303s(1)$ and the imaging signal line driver circuit $303s(2)$ are provided. In the touch panel 400, the line 406 is positioned between the display region and the region where the region 401(1) and the region 401(2) are provided. Such an arrangement of the line 406 can reduce the area seen from the top surface of the second part 104-1B in the first housing 104-1 and increase the area of the image signal line driver circuit $303s(1)$ and the imaging signal line driver circuit $303s(2)$ in the touch panel 300 and the area of the region 401(1) and the region 401(2) in the touch panel 400.

<Top View of Housing>

Figure 4:
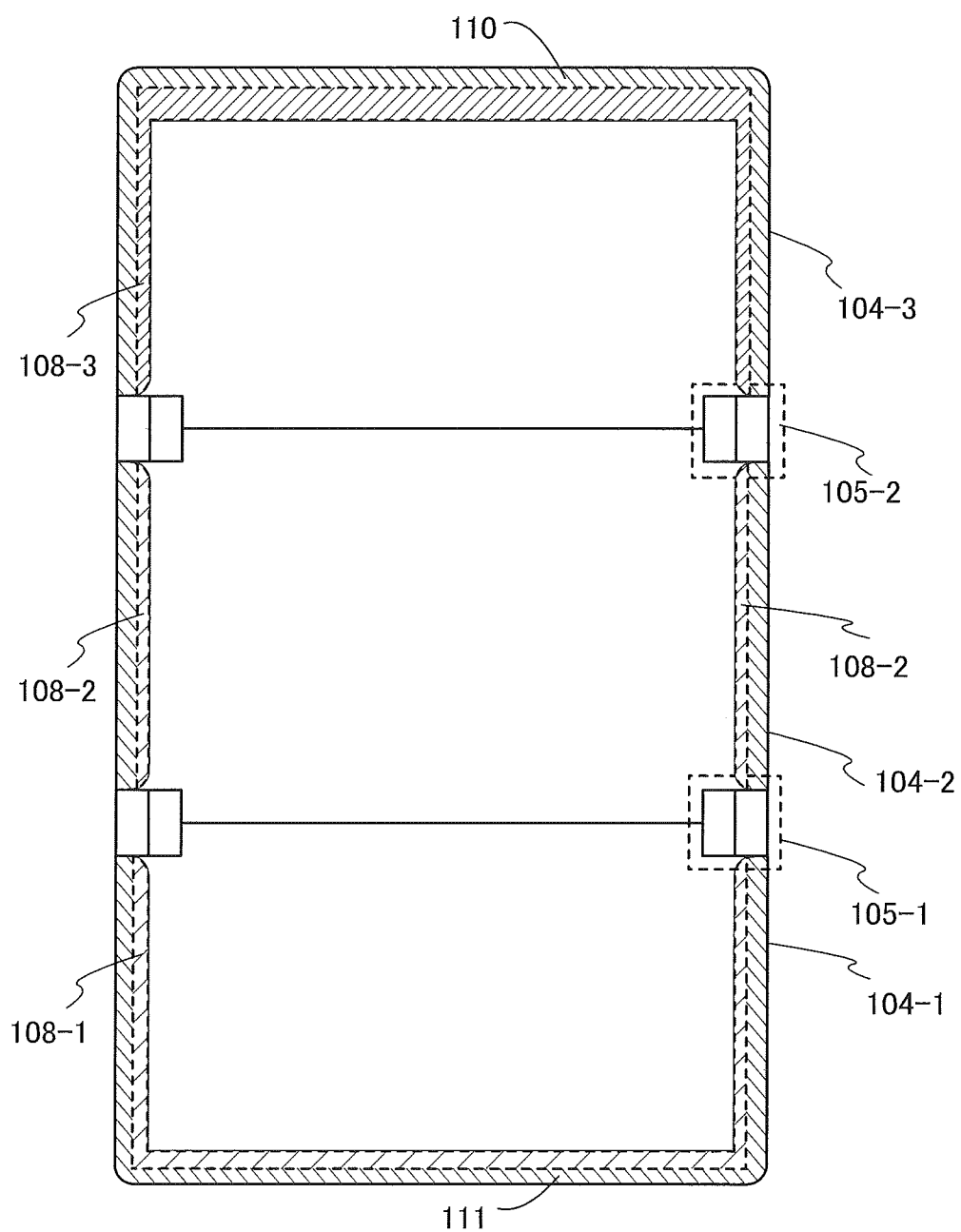
FIG. 4 illustrates a housing of an information processing device of an embodiment.

FIG. 4 illustrates an example of a structure that can be used as the housing in this embodiment. FIG. 4 illustrates the first housing 104-1, the second housing 104-2, the third housing 104-3, the hinge 105-1, the hinge 105-2, the slit 108-1, the slit 108-2, the slit 108-3, the end portion 110, and the end portion 111.

The end portion 110 is provided on a side of the slit 108-3 that is parallel to the axis of the hinge 105-2. Similarly, the end portion 111 is provided on a side of the slit 108-1 that is parallel to the axis of the hinge 105-1.

The panel substrate 101, the first film 102, and the second film 103 are each fixed to any part of the first housing 104-1. Hence, the distance between the end portion 111 and each of the panel substrate 101, the first film 102, and the second film 103 does not change when the information processing device is folded. In contrast, the distance between the end portion 110 and each of the panel substrate 101, the first film 102, and the second film 103 changes when the information processing device is folded. The maximum and minimum values of this distance change with the distance between the axis of the hinge 105-1 and the panel substrate 101 and the distance between the axis of the hinge 105-2 and the panel substrate 101.

The second film 103 may be fixed to the first housing 104-1, the second housing 104-2, and the third housing 104-3 in the case where high bending stress, compressive stress, and tensile stress are not applied to the second film 103 when the information processing device is folded.

Although the hinges 105-1 and 105-2 are simplified in FIGS. 1A and 1B and FIG. 4, the axis of the hinge 105-1 and the axis of the hinge 105-2 preferably overlap with the panel substrate 101 in the state of FIG. 1B. Such a positional relationship between the axes and the panel substrate 101 can reduce the sliding length of the panel substrate 101, the first film 102, and the second film 103 due to folding of the information processing device.

The end portion 110 is provided in the third housing 104-3 so as not to be in contact with neither the panel substrate 101, the first film 102, nor the second film 103 when the information processing device is folded and the panel substrate 101, the first film 102, and the second film 103 slide. In other words, the distance between the end portion 110 and each of the panel substrate 101, the first film 102, and the second film 103 is greater than 0. In addition, the end portion of the first film 102 overlaps with the second part 104-3B of the third housing 104-3 whenever the information processing device is folded. With the second part 104-3B provided in this manner, the end portions of the panel substrate 101, the first film 102, and the second film 103 can be prevented from being detached from the second part 104-3B or colliding with the end portion of the second part 104-3B. That is, in one embodiment of the present invention, it is possible to prevent warping, degradation, and fracture of the panel substrate 101, the first film 102, and the second film 103 due to a contact with the end portion 110.

In one embodiment of the present invention, a display region and a touch sensor circuit can be provided in the panel substrate 101 and the first film 102, respectively. However, in the case where the display portion and the touch sensor are displaced by sliding of the first film 102 and the panel substrate 101 and an input is performed on the display region, an unintended input might be caused. Therefore, both the touch sensor circuit and the display region are preferably provided in the panel substrate 101.

The information processing device of one embodiment of the present invention may be constituted only by the first film 102 and the panel substrate 101. In that case, the panel substrate 101 is in contact with the first film 102 so as to be slidable, and supported by the first housing 104-1, the second housing 104-2, and the third housing 104-3.

The information processing device of one embodiment of the present invention may be constituted only by three or more films and the panel substrate 101. In that case, one surface of the panel substrate 101 is in contact with a film and the other surface thereof is in contact with another film so that the panel substrate 101 and the films can slide, and the panel substrate 101 is supported by the first housing 104-1, the second housing 104-2, and the third housing 104-3.

The information processing device of one embodiment of the present invention may include one, two, or four or more housings. When one of the connected housings of the information processing device is referred to as a first housing, the first film 102 and the panel substrate 101 can slide in a slit of a housing other than the first housing.

Embodiment 2

In this embodiment, a foldable touch panel that is included in an information processing device of one embodiment of the present invention will be described with reference to FIGS. 5A to 5C.

Figure 5A:
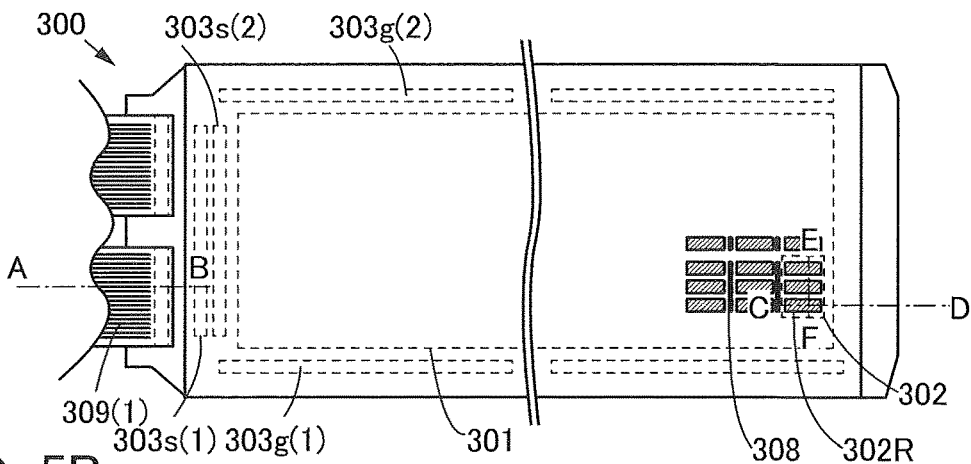
FIGS. 5A to 5C illustrate structures of a touch panel that can be used in an information processing device of an embodiment.

FIG. 5A is a top view illustrating a structure of the touch panel that can be used in the information processing device of one embodiment of the present invention. The components in FIG. 5A correspond to those in FIG. 3A.

Figure 5B:
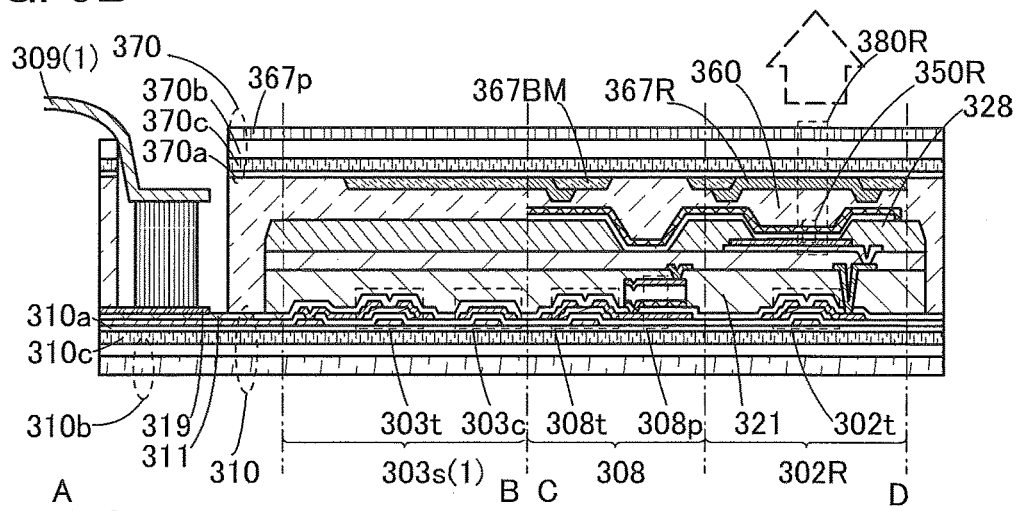

FIG. 5B is a cross-sectional view along line A-B and line C-D in FIG. 5A.

Figure 5C:
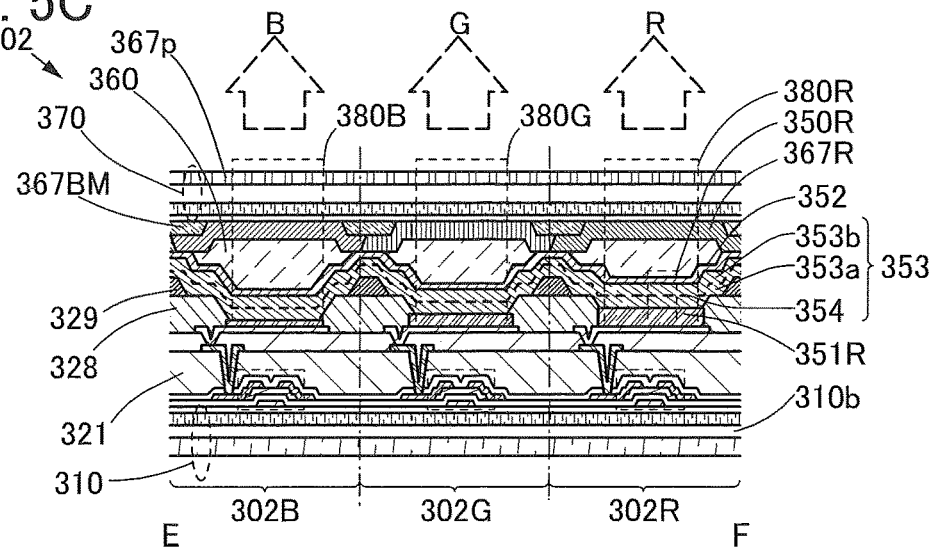

FIG. 5C is a cross-sectional view along line E-F in FIG. 5A.

<Cross-Sectional View>

The touch panel 300 includes a substrate 310 and a counter substrate 370 that faces the substrate 310 (see FIG. 5B).

When a material having flexibility is used for the substrate 310 and the counter substrate 370, the touch panel 300 can have flexibility.

Note that when the flexible touch panel 300 is changed in its form, stress is applied to a functional element provided in the touch panel 300. Preferably, the functional element is positioned substantially at the midpoint between the substrate 310 and the counter substrate 370, in which case a change in the form of the functional element can be prevented.

Furthermore, the substrate 310 is preferably formed using a material whose coefficient of linear expansion is substantially equal to that of the counter substrate 370. The coefficient of linear expansion of the material is preferably lower than or equal to $1 \times 10^{-3}$/K, more preferably lower than or equal to $5 \times 10^{-5}$/K, and still more preferably lower than or equal to $1 \times 10^{-5}$/K.

For example, materials that contain polyester, polyolefin, polyamide (e.g., nylon or aramid), polyimide, polycarbonate, polyurethane, an acrylic resin, an epoxy resin, or a resin having a siloxane bond such as silicone, can be used for the substrate 310 and the counter substrate 370.

The substrate 310 is a stack including a substrate 310b having flexibility, a barrier film 310a that prevents diffusion of impurities into light-emitting elements, and a resin layer 310c that attaches the barrier film 310a to the substrate 310b.

The counter substrate 370 is a stack including a base 370b having flexibility, a barrier film 370a that prevents diffusion of impurities into the light-emitting elements, and a resin layer 370c that attaches the barrier film 370a to the base 370b (see FIG. 5B).

A sealant 360 attaches the counter substrate 370 to the substrate 310. The sealant 360 also serving as an optical adhesive layer has a refractive index higher than that of air. The pixel circuits and the light-emitting elements (e.g., a first light-emitting element 350R) are provided between the substrate 310 and the counter substrate 370.

<Structure of Pixel>

Each of the pixels 302 includes a sub-pixel 302R, a sub-pixel 302G, and a sub-pixel 302B (see FIG. 5C). The sub-pixel 302R includes a light-emitting module 380R, the sub-pixel 302G includes a light-emitting module 380G, and the sub-pixel 302B includes a light-emitting module 380B.

For example, the sub-pixel 302R includes the first light-emitting element 350R and the pixel circuit that can supply electric power to the first light-emitting element 350R and includes a transistor 302$t$ (see FIG. 5B). Furthermore, the light-emitting module 380R includes the first light-emitting element 350R and an optical element (e.g., a first coloring layer 367R).

The first light-emitting element 350R includes a first lower electrode 351R, an upper electrode 352, and a layer 353 containing a light-emitting organic compound between the first lower electrode 351R and the upper electrode 352 (see FIG. 5C).

The layer 353 containing a light-emitting organic compound includes a light-emitting unit 353$a$, a light-emitting unit 353$b$, and an intermediate layer 354 between the light-emitting units 353$a$ and 353$b$.

The light-emitting module 380R includes the first coloring layer 367R on the counter substrate 370. The coloring layer transmits light with a particular wavelength and is, for example, a layer that selectively transmits red, green, or blue light. Alternatively, a region that transmits light emitted from the light-emitting element as it is may be provided.

The light-emitting module 380R, for example, includes the sealant 360 that is in contact with the first light-emitting element 350R and the first coloring layer 367R.

The first coloring layer 367R is positioned in a region overlapping with the first light-emitting element 350R. Accordingly, part of light emitted from the first light-emitting element 350R passes through the sealant 360, which also serves as an optical adhesive layer, and the first coloring layer 367R and is emitted to the outside of the light-emitting module 380R as indicated by arrows in FIGS. 5B and 5C. The information processing device of one embodiment of the present invention includes the first film 102 in the direction of the arrows.

<Structure of Display Panel>

The touch panel 300 includes a light-blocking layer 367BM on the counter substrate 370. The light-blocking layer 367BM is provided so as to surround the coloring layer (e.g., the first coloring layer 367R).

The touch panel 300 includes an anti-reflective layer 367$p$ positioned in a region overlapping with the display portion 301. As the anti-reflective layer 367$p$, for example, a circular polarizing plate can be used.

The touch panel 300 includes an insulating film 321. In FIG. 5B, the insulating film 321 covers the transistor 302$t$. Note that the insulating film 321 can be used as a layer for planarizing unevenness caused by the pixel circuits. The insulating film 321 may be an insulating film on which a layer that can prevent diffusion of impurities into the transistor 302$t$ and the like is stacked.

The touch panel 300 includes the light-emitting elements (e.g., the first light-emitting element 350R) over the insulating film 321.

The touch panel 300 includes, over the insulating film 321, a partition wall 328 that overlaps with an end portion of the first lower electrode 351R (see FIG. 5C). In addition, a spacer 329 that controls the distance between the substrate 310 and the counter substrate 370 is provided on the partition wall 328.

<Structure of Image Signal Line Driver Circuit>

The image signal line driver circuit 303$s$(1) includes a transistor 303$t$ and a capacitor 303$c$. Note that the driver circuit and the pixel circuits can be formed in the same process and over the same substrate.

<Structure of Imaging Pixel>

The imaging pixels 308 each include a photoelectric conversion element 308$p$ and an imaging pixel circuit for sensing light received by the photoelectric conversion element 308$p$. The imaging pixel circuit includes a transistor 308$t$.

For example, a PIN photodiode can be used as the photoelectric conversion element 308$p$.

<Other Components>

The touch panel 300 includes a wiring 311 for supplying a signal. The wiring 311 is provided with a terminal 319. Note that an FPC 309(1) that can supply a signal such as an image signal or a synchronization signal is electrically connected to the terminal 319. The terminal 319 may be connected to two FPCs, the FPC 309(1) and an FPC 309(2) (see FIG. 5A), or may be connected to one FPC 309.

Note that a printed wiring board (PWB) may be attached to the FPC 309(1).

Transistors formed in the same process can be used as the transistor 302$t$, the transistor 303$t$, the transistor 308$t$, and the like.

Transistors of a bottom-gate type, a top-gate type, or the like can be used.

Various kinds of semiconductors can be used in the transistors. For example, an oxide semiconductor, single crystal silicon, polysilicon, amorphous silicon, or the like can be used.

Note that this embodiment can be combined with any of the other embodiments in this specification as appropriate.

Embodiment 3

In this embodiment, a structure of a flexible touch panel that can be used in the panel substrate of the information processing device of one embodiment of the present invention will be described with reference to FIGS. 6A and 6B and FIGS. 7A to 7C.

Figure 6A:
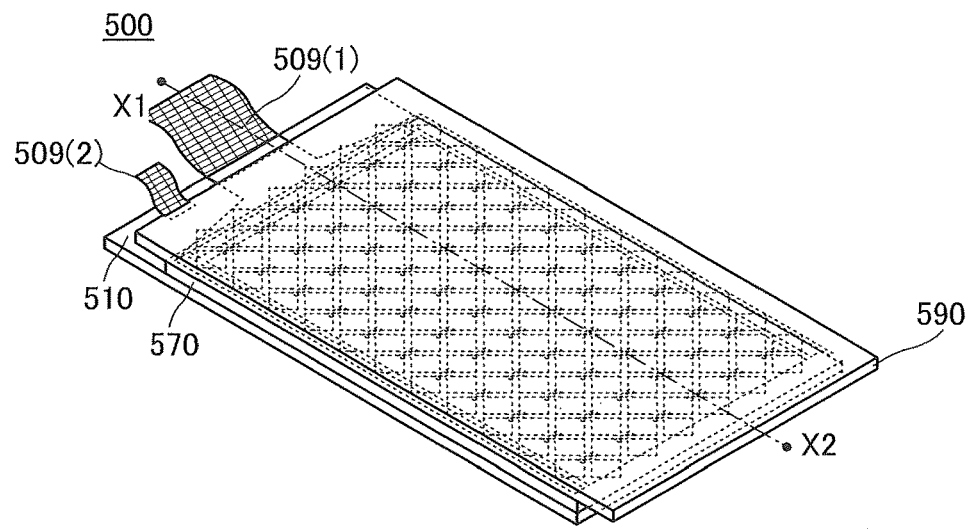
FIGS. 6A and 6B illustrate structures of a touch panel that can be used in an information processing device of an embodiment.
Figure 6B:
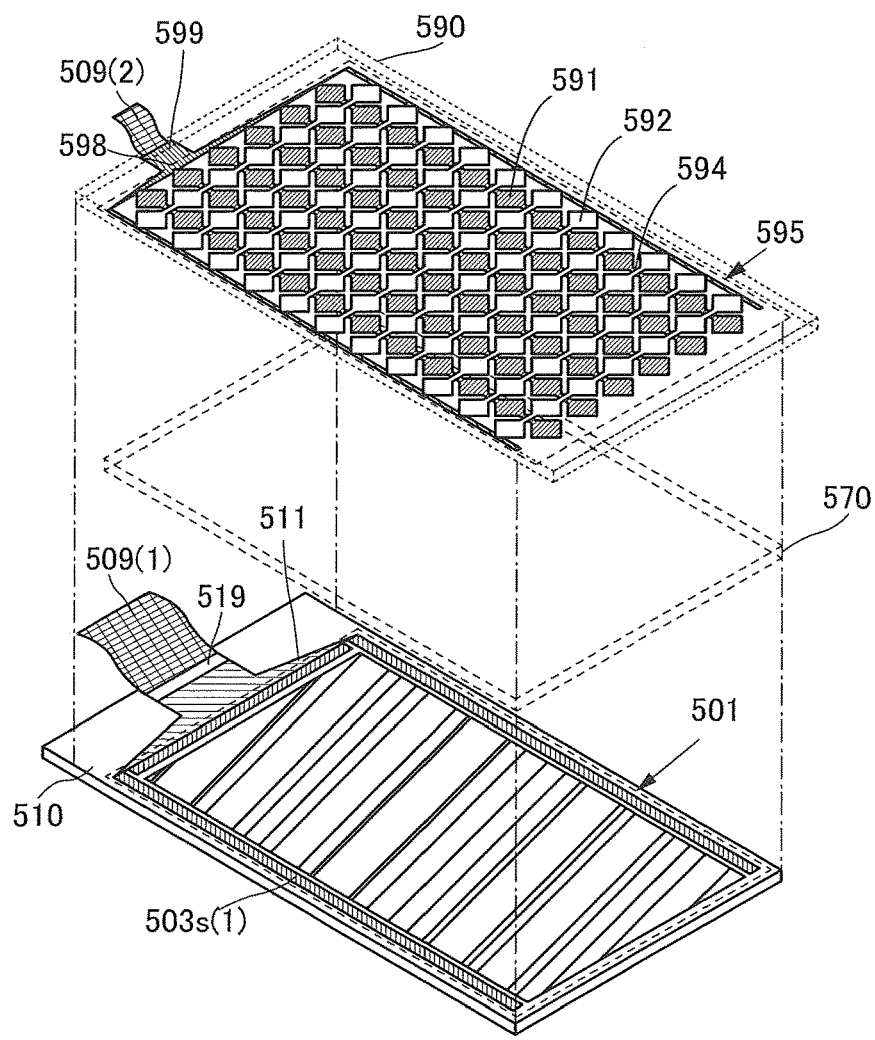

FIG. 6A is a perspective view of a touch panel 500 exemplified in this embodiment. Note that FIGS. 6A and 6B illustrate only main components for simplicity. FIG. 6B is a perspective view of the touch panel 500.

Figure 7A:
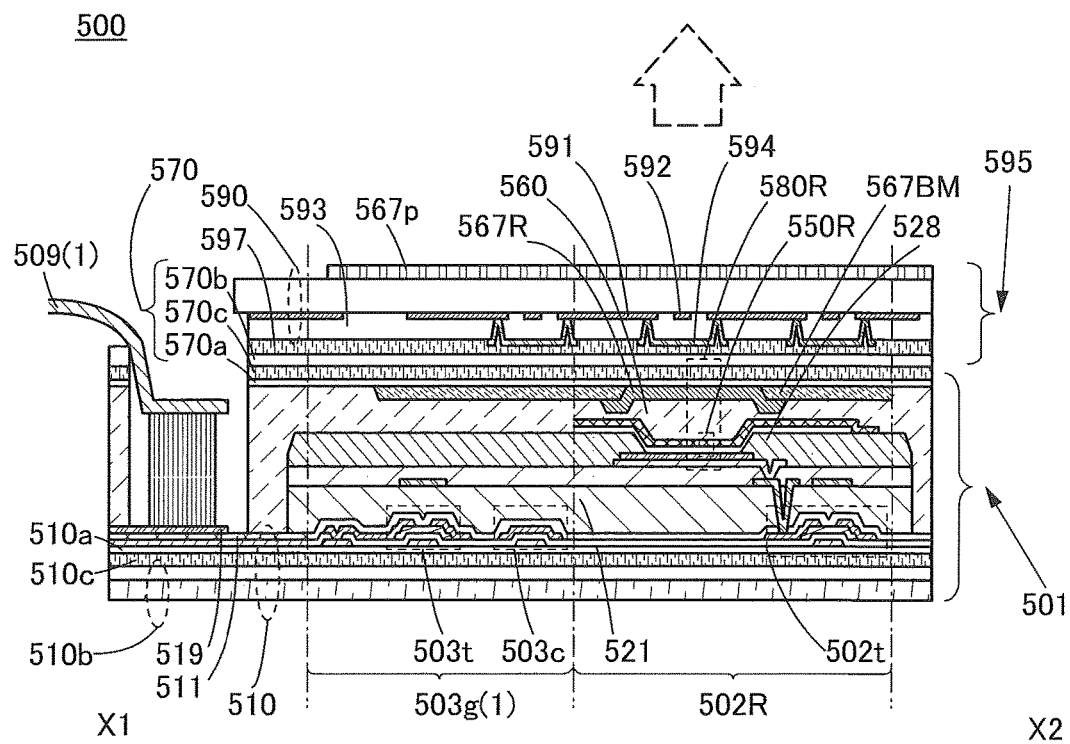
FIGS. 7A to 7C illustrate structures of a touch panel that can be used in an information processing device of an embodiment.

FIG. 7A is a cross-sectional view of the touch panel 500 along X1-X2 in FIG. 6A.

The touch panel 500 includes a display portion 501 and a touch sensor 595 (see FIG. 6B). Furthermore, the touch panel 500 includes a substrate 510, a substrate 570, and a substrate 590. Note that the substrates 510, 570, and 590 each have flexibility.

The display portion 501 includes the substrate 510, a plurality of pixels over the substrate 510, a plurality of wirings 511 through which signals are supplied to the pixels, and an image signal line driver circuit 503$s$(1). The plurality of wirings 511 are led to a peripheral portion of the substrate 510, and part of the plurality of wirings 511 forms a terminal 519. The terminal 519 is electrically connected to an FPC 509(1).

<Touch Sensor>

The substrate 590 includes the touch sensor 595 and a plurality of wirings 598 electrically connected to the touch sensor 595. The plurality of wirings 598 are led to a peripheral portion of the substrate 590, and part of the plurality of wirings 598 forms a terminal. The terminal is electrically connected to an FPC 509(2). Note that in FIG.

6B, electrodes, wirings, and the like of the touch sensor 595 provided on the back side of the substrate 590 (the side that faces the substrate 510) are indicated by solid lines for clarity.

As the touch sensor 595, for example, a capacitive touch sensor can be used. Examples of the capacitive touch sensor include a surface capacitive touch sensor and a projected capacitive touch sensor.

Examples of the projected capacitive touch sensor include a self capacitive touch sensor and a mutual capacitive touch sensor, which differ mainly in the driving method. The use of a mutual capacitive type is preferred because multiple points can be sensed simultaneously.

The case of using a projected capacitive touch sensor will be described below with reference to FIG. 6B.

Note that a variety of sensors that can sense the proximity or touch of a sensing target such as a finger, can be used.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 6A and 6B.

The electrodes 591 each have a quadrangular shape and are arranged in the direction intersecting with the direction in which the electrodes 592 extend.

A wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light transmitted through the touch sensor 595 can be reduced.

Note that the shapes of the electrodes 591 and the electrodes 592 are not limited to the above-mentioned shapes and can be any of a variety of shapes. For example, the plurality of electrodes 591 may be provided so that the space between the electrodes 591 is reduced as much as possible, and the plurality of electrodes 592 may be provided with an insulating layer sandwiched between the electrodes 591 and the electrodes 592 and may be spaced apart from each other to form a region not overlapping with the electrodes 591. In that case, a dummy electrode that is electrically insulated from these electrodes is preferably provided between two adjacent electrodes 592, whereby the area of a region having a different transmittance can be reduced.

The structure of the touch sensor 595 will be described with reference to FIGS. 7A to 7C.

The touch sensor 595 includes the substrate 590, the electrodes 591 and the electrodes 592 provided in a staggered arrangement on the substrate 590, an insulating layer 593 covering the electrodes 591 and the electrodes 592, and the wiring 594 that electrically connects the adjacent electrodes 591 to each other.

A resin layer 597 attaches the substrate 590 to the substrate 570 such that the touch sensor 595 overlaps with the display portion 501.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used. The film including graphene can be formed, for example, by reducing a film including graphene oxide. As a reducing method, a method of applying heat or the like can be employed.

The electrodes 591 and the electrodes 592 can be formed by depositing a light-transmitting conductive material on the substrate 590 by a sputtering method and then removing an unnecessary portion by any of various patterning techniques such as photolithography.

Examples of a material for the insulating layer 593 include an acrylic resin, an epoxy resin, a resin having a siloxane bond such as silicone, and inorganic insulating materials such as silicon oxide, silicon oxynitride, and aluminum oxide.

Furthermore, openings that reach the electrodes 591 are formed in the insulating layer 593, and the wiring 594 electrically connects the adjacent electrodes 591. A light-transmitting conductive material can be favorably used for the wiring 594 because the aperture ratio of the touch panel can be increased. Moreover, a material that has higher conductivity than the electrodes 591 and 592 can be favorably used for the wiring 594 because electric resistance can be reduced.

One electrode 592 extends in one direction, and a plurality of electrodes 592 are provided in the form of stripes.

The wiring 594 intersects with the electrode 592.

Adjacent electrodes 591 are provided with one electrode 592 provided therebetween. The wiring 594 electrically connects the adjacent electrodes 591.

Note that the plurality of electrodes 591 are not necessarily arranged in the direction orthogonal to one electrode 592 and may be arranged to intersect with one electrode 592 at an angle of less than 90 degrees.

One wiring 598 is electrically connected to any of the electrodes 591 and 592. Part of the wiring 598 serves as a terminal. For the wiring 598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 593 and the wiring 594 may be provided to protect the touch sensor 595.

Figure 7B:
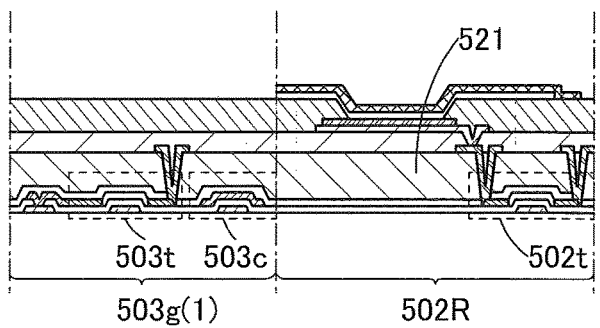
Figure 7C:
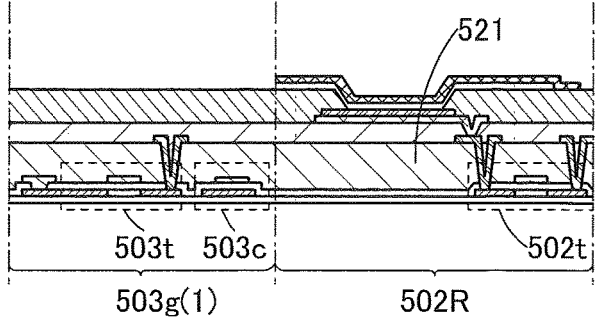

Although not illustrated in FIGS. 7A to 7C, a connection layer 599 electrically connects the wiring 598 to the FPC 509(2).

As the connection layer 599, any of various anisotropic conductive films (ACF), anisotropic conductive pastes (ACP), and the like can be used.

The resin layer 597 has a light-transmitting property. For example, a thermosetting resin or an ultraviolet curable resin can be used; specifically, an acrylic resin, polyurethane, an epoxy resin, or a resin having a siloxane bond such as silicone can be used.

<Display Portion>

The display portion 501 includes a plurality of pixels arranged in a matrix. Each of the pixels includes a display element and a pixel circuit for driving the display element.

In the description of this embodiment, an organic electroluminescent element that emits white light is used as a display element; however, the display element is not limited to such an element.

For example, organic electroluminescent elements that emit light of different colors may be included in sub-pixels so that the light of different colors can be emitted from the respective sub-pixels.

Other than organic electroluminescent elements, various display elements such as display elements (electronic ink)

that perform display by an electrophoretic method, an electrowetting method, or the like; MEMS shutter display elements; optical interference type MEMS display elements; and liquid crystal elements can be used. Furthermore, this embodiment can be used in a transmissive liquid crystal display, a transflective liquid crystal display, a reflective liquid crystal display, a direct-view liquid crystal display, or the like. In the case of a transflective liquid crystal display or a reflective liquid crystal display, some or all of pixel electrodes function as reflective electrodes. For example, some or all of pixel electrodes are formed to contain aluminum, silver, or the like. In such a case, a storage circuit such as an SRAM can be provided under the reflective electrodes, leading to lower power consumption. A structure suitable for employed display elements can be selected from a variety of structures of pixel circuits.

In the display portion, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. These elements are manufactured in a small number of steps, resulting in reduced manufacturing costs or improved yield. Alternatively, the aperture ratio can be increased because these elements have small sizes, which reduces power consumption or achieves higher luminance.

As a method other than the active matrix method, the passive matrix method in which an active element (a non-linear element) is not used can also be used. Since an active element (a non-linear element) is not used, the number of manufacturing steps can be reduced, resulting in reduced manufacturing costs or improved yield. The aperture ratio can be increased because an active element (a non-linear element) is not used, which reduces power consumption, achieves higher luminance, and the like.

Flexible materials can be favorably used for the substrate 510 and the substrate 570.

Materials with which passage of impurities is inhibited can be favorably used for the substrate 510 and the substrate 570. For example, materials with a vapor permeability of lower than or equal to $10^{-5}$ g/m²·day, preferably lower than or equal to $10^{-6}$ g/m²·day can be favorably used.

The substrate 510 can be favorably formed using a material whose coefficient of linear expansion is substantially equal to that of the substrate 570. For example, the coefficient of linear expansion of the material is preferably lower than or equal to $1\times10^{-3}$/K, more preferably lower than or equal to $5\times10^{-5}$/K, and still more preferably lower than or equal to $1\times10^{-5}$/K.

The substrate 510 is a stack including a substrate 510b having flexibility, a barrier film 510a that prevents diffusion of impurities into light-emitting elements, and a resin layer 510c that attaches the barrier film 510a to the substrate 510b.

For example, polyester, polyolefin, polyamide (e.g., nylon or aramid), polyimide, polycarbonate, an acrylic resin, polyurethane, an epoxy resin, or a resin having a siloxane bond such as silicone, can be used for the resin layer 510c.

The substrate 570 is a stack including a substrate 570b having flexibility, a barrier film 570a that prevents diffusion of impurities into light-emitting elements, and a resin layer 570c that attaches the barrier film 570a to the substrate 570b.

A sealant 560 attaches the substrate 570 to the substrate 510. The sealant 560 has a refractive index higher than that of air. In the case of extracting light to the sealant 560 side, the sealant 560 also serves as an optical adhesive layer. The pixel circuits and the light-emitting elements (e.g., a first light-emitting element 550R) are positioned between the substrate 510 and the substrate 570.

<Structure of Pixel>

A pixel includes a sub-pixel 502R, and the sub-pixel 502R includes a light-emitting module 580R.

The sub-pixel 502R includes the first light-emitting element 550R and the pixel circuit that can supply electric power to the first light-emitting element 550R and includes a transistor 502t. Furthermore, the light-emitting module 580R includes the first light-emitting element 550R and an optical element (e.g., a first coloring layer 567R).

The first light-emitting element 550R includes a lower electrode, an upper electrode, and a layer containing a light-emitting organic compound between the lower electrode and the upper electrode.

The light-emitting module 580R includes the first coloring layer 567R on the light extraction side. The coloring layer transmits light with a particular wavelength and is, for example, a layer that selectively transmits red, green, or blue light. Note that in another sub-pixel, a region that transmits light emitted from the light-emitting element as it is may be provided.

In the case where the sealant 560 is provided on the light extraction side, the sealant 560 is in contact with the first light-emitting element 550R and the first coloring layer 567R.

The first coloring layer 567R is positioned in a region overlapping with the first light-emitting element 550R. Accordingly, part of light emitted from the first light-emitting element 550R passes through the first coloring layer 567R and is emitted to the outside of the light-emitting module 580R as indicated by an arrow in FIG. 7A. The information processing device of one embodiment of the present invention includes the first film 102 in the direction of the arrow.

<Structure of Display Portion>

The display portion 501 includes a light-blocking layer 567BM on the light extraction side. The light-blocking layer 567BM is provided so as to surround the coloring layer (e.g., the first coloring layer 567R).

The display portion 501 includes an anti-reflective layer 567p positioned in a region overlapping with pixels. As the anti-reflective layer 567p, a circular polarizing plate can be used, for example.

The display portion 501 includes an insulating film 521. The insulating film 521 covers the transistor 502t. Note that the insulating film 521 can be used as a layer for planarizing unevenness due to the pixel circuit. A layered film including a layer that can prevent diffusion of impurities can be used as the insulating film 521. This can prevent the reliability of the transistor 502t or the like from being lowered by diffusion of impurities.

The display portion 501 includes the light-emitting elements (e.g., the first light-emitting element 550R) over the insulating film 521.

The display portion 501 includes, over the insulating film 521, a partition wall 528 that overlaps with an end portion of the lower electrode. In addition, a spacer that controls the distance between the substrate 510 and the substrate 570 is provided on the partition wall 528.

<Structure of Scan Line Driver Circuit>

A scan line driver circuit 503g(1) includes a transistor 503t and a capacitor 503c. Note that the driver circuit and the pixel circuits can be formed in the same process and over the same substrate.

<Other Components>

The display portion 501 includes the wirings 511 for supplying signals. The wirings 511 are provided with the terminal 519. Note that the FPC 509(1) through which a signal such as an image signal or a synchronization signal can be supplied is electrically connected to the terminal 519.

Note that a printed wiring board (PWB) may be attached to the FPC 509(1).

The display portion 501 includes wirings such as scan lines, signal lines, and power supply lines. Various conductive films can be used for the wirings.

Specifically, a metal element selected from aluminum, chromium, copper, tantalum, titanium, molybdenum, tungsten, nickel, yttrium, zirconium, silver, and manganese; an alloy containing any of the above-described metal elements; an alloy containing any of the above-described metal elements in combination; or the like can be used. In particular, one or more elements selected from aluminum, chromium, copper, tantalum, titanium, molybdenum, and tungsten are preferably contained. In particular, an alloy of copper and manganese is suitably used in microfabrication with a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Specifically, a stacked structure in which an alloy film or a nitride film that contains one or more elements selected from titanium, tantalum, tungsten, molybdenum, chromium, neodymium, and scandium is stacked over an aluminum film can be used.

Alternatively, a light-transmitting conductive material containing indium oxide, tin oxide, or zinc oxide may be used.

Modification Example 1 of Display Portion

Various kinds of transistors can be used in the display portion 501.

In the structure illustrated in FIGS. 7A and 7B, bottom-gate transistors are used in the display portion 501.

For example, a semiconductor layer containing an oxide semiconductor, amorphous silicon, or the like can be used in the transistor 502t and the transistor 503t illustrated in FIG. 7A.

For example, a film represented by an In-M-Zn oxide that contains at least indium (In), zinc (Zn), and M (a metal such as Al, Ga, Ge, Y, Zr, Sn, La, Ce, or Hf) is preferably included. Alternatively, both In and Zn are preferably contained.

As a stabilizer, gallium (Ga), tin (Sn), hafnium (Hf), aluminum (Al), zirconium (Zr), or the like can be used. Other examples of the stabilizer include lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As an oxide semiconductor included in an oxide semiconductor film, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, and an In—Ga-based oxide.

Note that here, an In—Ga—Zn-based oxide means an oxide containing In, Ga, and Zn as its main components and there is no limitation on the ratio of In:Ga:Zn. The In—Ga—Zn-based oxide may contain another metal element in addition to In, Ga, and Zn.

For example, a semiconductor layer containing polycrystalline silicon that is obtained by crystallization process such as laser annealing can be used in the transistor 502t and the transistor 503t illustrated in FIG. 7B.

In the structure illustrated in FIG. 7C, top-gate transistors are used in the display portion 501.

For example, a semiconductor layer containing polycrystalline silicon, a single crystal silicon film that is transferred from a single crystal silicon substrate, or the like can be used in the transistor 502t and the transistor 503t illustrated in FIG. 7C.

Note that this embodiment can be combined with any of the other embodiments in this specification as appropriate.

Embodiment 4

In this embodiment, a structure of a flexible touch panel that can be used in the information processing device of one embodiment of the present invention will be described with reference to FIGS. 8A to 8C.

Figure 8A:
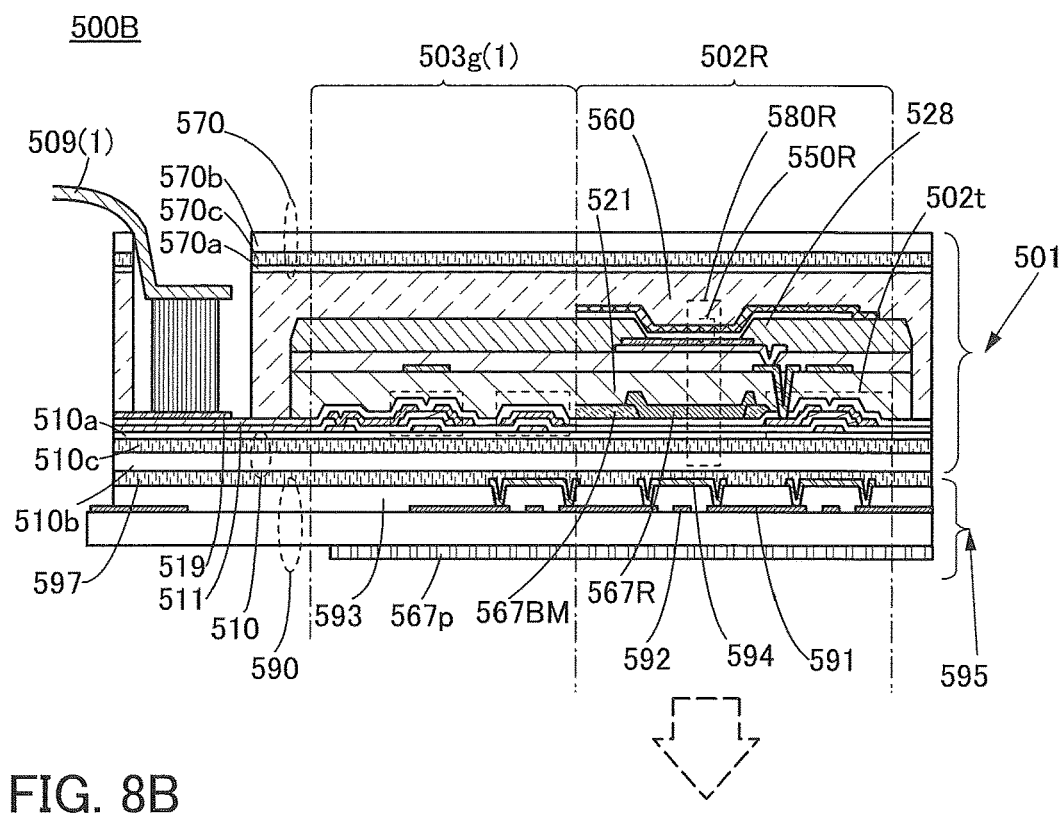
FIGS. 8A to 8C illustrate structures of a touch panel that can be used in an information processing device of an embodiment.
Figure 8B:
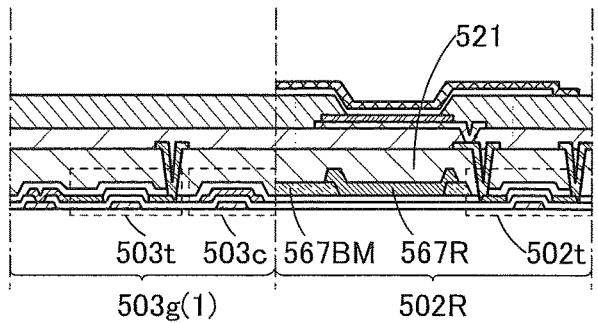
Figure 8C:
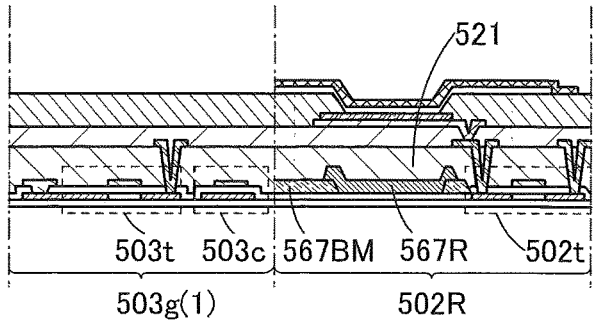

FIGS. 8A to 8C are cross-sectional views of a touch panel 500B.

The touch panel 500B described in this embodiment is different from the touch panel 500 described in Embodiment 3 in that the display portion 501 displays received image data on the side where the transistors are provided and that the touch sensor is provided on the substrate 510 side of the display portion. Different structures will be described in detail below, and the above description is referred to for the other similar structures.

<Display Portion>

The display portion 501 includes a plurality of pixels arranged in a matrix. Each of the pixels includes a display element and a pixel circuit for driving the display element.

<Structure of Pixel>

A pixel includes a sub-pixel 502R, and the sub-pixel 502R includes a light-emitting module 580R.

The sub-pixel 502R includes the first light-emitting element 550R and the pixel circuit that can supply electric power to the first light-emitting element 550R and includes the transistor 502t.

The light-emitting module 580R includes the first light-emitting element 550R and an optical element (e.g., the first coloring layer 567R).

The first light-emitting element 550R includes a lower electrode, an upper electrode, and a layer containing a light-emitting organic compound between the lower electrode and the upper electrode.

The light-emitting module 580R includes the first coloring layer 567R on the light extraction side. The coloring layer transmits light with a particular wavelength and is, for example, a layer that selectively transmits red, green, or blue light. Note that in another sub-pixel, a region that transmits light emitted from the light-emitting element as it is may be provided.

The first coloring layer 567R is positioned in a region overlapping with the first light-emitting element 550R. In addition, the first light-emitting element 550R illustrated in FIG. 8A emits light to the side where the transistor 502t is provided. Accordingly, part of light emitted from the first light-emitting element 550R passes through the first coloring layer 567R and is emitted to the outside of the light-emitting module 580R as indicated by an arrow in FIG. 8A. The information processing device of one embodiment of the present invention includes the first film 102 in the direction of the arrow.

<Structure of Display Portion>

The display portion 501 includes a light-blocking layer 567BM on the light extraction side. The light-blocking layer 567BM is provided so as to surround the coloring layer (e.g., the first coloring layer 567R).

The display portion 501 includes the insulating film 521. The insulating film 521 covers the transistor 502t. Note that the insulating film 521 can be used as a layer for planarizing unevenness due to the pixel circuit. A layered film including a layer that can prevent diffusion of impurities can be used as the insulating film 521. This can prevent the reliability of the transistor 502t or the like from being lowered by, for example, impurities diffused from the first coloring layer 567R.

<Touch Sensor>

The touch sensor 595 is provided on the substrate 510 side of the display portion 501 (see FIG. 8A).

The resin layer 597 is positioned between the substrate 510 and the substrate 590 and bonds the touch sensor 595 to the display portion 501.

Modification Example 1 of Display Portion

Various kinds of transistors can be used in the display portion 501.

In the structure illustrated in FIGS. 8A and 8B, bottom-gate transistors are used in the display portion 501.

For example, a semiconductor layer containing an oxide semiconductor, amorphous silicon, or the like can be used in the transistor 502t and the transistor 503t illustrated in FIG. 8A. In addition, a pair of gate electrodes may be provided so that a channel formation region of the transistor is sandwiched therebetween. This can reduce variations in characteristics of the transistors and increase the reliability.

For example, a semiconductor layer containing polycrystalline silicon or the like can be used in the transistor 502t and the transistor 503t illustrated in FIG. 8B.

In the structure illustrated in FIG. 8C, top-gate transistors are used in the display portion 501.

For example, a semiconductor layer containing polycrystalline silicon, a transferred single crystal silicon film, or the like can be used in the transistor 502t and the transistor 503t illustrated in FIG. 8C.

Note that this embodiment can be combined with any of the other embodiments in this specification as appropriate.

Embodiment 5

In this embodiment, a method for manufacturing a foldable device that can be used in the information processing device of one embodiment of the present invention or electronic devices will be described with reference to FIG. 9A to FIG. 11D. Note that examples of the foldable device include a display device, a light-emitting device, and an input device. Examples of the input device include a touch sensor and a touch panel. Examples of the light-emitting device include an organic EL panel and a lighting device. Examples of the display device include a light-emitting device, an organic EL panel, and a liquid crystal display device. Note that a function of the input device such as a touch sensor may be provided in a display device or a light-emitting device. For example, a counter substrate (e.g., a substrate not provided with a transistor) of a display device or a light-emitting device may be provided with a touch sensor. Alternatively, an element substrate (e.g., a substrate provided with a transistor) of the display device or the light-emitting device may be provided with a touch sensor. Still alternatively, the counter substrate and the element substrate of the display device or the light-emitting device may be provided with touch sensors.

Figure 9A:
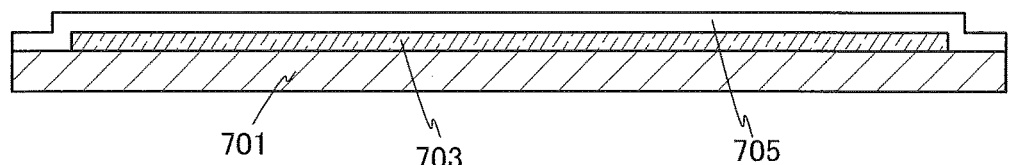
FIGS. 9A to 9D illustrate a method for manufacturing a foldable device of an embodiment.
Figure 9B:
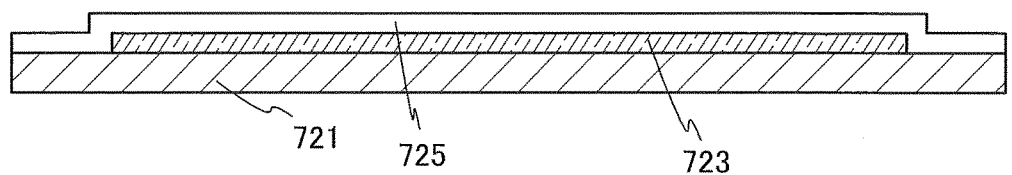

First, a separation layer 703 is formed over a formation substrate 701, and a layer to be separated 705 is formed over the separation layer 703 (FIG. 9A). Moreover, a separation layer 723 is formed over a formation substrate 721, and a layer to be separated 725 is formed over the separation layer 723 (FIG. 9B).

For example, when a tungsten film is used as the separation layer, a tungsten oxide film can be formed between the layer to be separated and the tungsten film by an oxidation method such as performing plasma treatment on the tungsten film with a gas containing oxygen such as $N_2O$, annealing the tungsten film in a gas atmosphere containing oxygen, or forming a tungsten oxide film by sputtering or the like in a gas atmosphere containing oxygen.

In a separating and transferring process of the tungsten oxide film, it is preferable that tungsten oxide mainly have a composition in which the ratio of oxygen to tungsten is lower than 3. In a homologous series of tungsten oxides such as $W_nO_{(3n-1)}$ or $W_nO_{(3n-2)}$ (n is a natural number greater than or equal to 1), shear is easily caused by heating of a crystal optical shear plane therein. When the tungsten oxide film is formed by $N_2O$ plasma treatment, the layer to be separated can be separated from the substrate with a weak force.

Alternatively, the tungsten oxide film can be directly formed without forming the tungsten film. For example, only the tungsten oxide film may be formed as the separation layer by performing plasma treatment on a sufficiently thin tungsten film with a gas containing oxygen, annealing a sufficiently thin tungsten film in a gas atmosphere containing oxygen, or forming the tungsten oxide film by sputtering or the like in a gas atmosphere containing oxygen.

When the separation is caused at the interface between the tungsten film and the tungsten oxide film or within the tungsten oxide film, the tungsten oxide film remains on the side of the layer to be separated in some cases. The remaining tungsten oxide film might adversely affect the properties of a transistor. Thus, a step of removing the tungsten oxide film is preferably performed after the step of separating the separation layer and the layer to be separated. Note that the above method for separation from the substrate does not necessarily require $N_2O$ plasma treatment, so that the step of removing the tungsten oxide film can also be omitted. In that case, the device can be fabricated more easily.

In one embodiment of the present invention, a tungsten film with a thickness of greater than or equal to 0.1 nm and less than 200 nm is formed over the substrate.

As the separation layer, a film containing molybdenum, titanium, vanadium, tantalum, silicon, aluminum, or an alloy thereof can be used, besides a tungsten film. Furthermore, it is also possible to use a stack of such a film and its oxide film. The separation layer is not limited to an inorganic film, and an organic film such as polyimide may be used.

In the case where an organic resin is used for the separation layer, a process temperature needs to be lower than or equal to 350° C. to use low-temperature polysilicon in a semiconductor layer. Thus, dehydrogenation baking for silicon crystallization, hydrogenation for termination of defects in silicon, activation of a doped region, or the like cannot be performed sufficiently, which limits the performance of the transistor. On the other hand, in the case where an inorganic film is used, the process temperature is not limited to 350° C., and excellent characteristics of a transistor can be obtained.

In the case where the organic resin is used for the separation layer, the organic resin or a functional element is damaged in some cases by laser irradiation for crystallization; thus, it is preferable to use an inorganic film for the separation layer because such a problem is not caused.

Furthermore, in the case where the organic resin is used for the separation layer, the organic resin shrinks by laser irradiation for separating the resin and contact failure is caused in the contact portion of the terminal of an FPC or the like, which makes it difficult for functional elements with many terminals in a high-definition display or the like to be separated and transferred with high yield. There is no such limitation in the case where an inorganic film is used for the separation layer, and functional elements with many terminals in a high-definition display or the like can be separated and transferred with high yield.

In the method for separating a functional element from a substrate of one embodiment of the present invention, an insulating layer and a transistor can be formed over a formation substrate at a temperature of lower than or equal to 600° C. In that case, high-temperature polysilicon can be used for a semiconductor layer. With use of a conventional production line for high-temperature polysilicon, a semiconductor device with a high operation speed, a high gas barrier property, and high reliability can be mass-produced. In that case, with use of the insulating layer and the transistor formed through a process at 600° C. or lower, insulating layers with an excellent gas barrier property formed at a temperature of lower than or equal to 600° C. can be provided above and below an organic EL element. Accordingly, entry of impurities such as moisture into the organic EL element or the semiconductor layer can be suppressed, whereby an extraordinarily reliable light-emitting device can be obtained as compared with the case of using the organic resin or the like for the separation layer.

Alternatively, the insulating layer and the transistor can be formed over the formation substrate at 500° C. or lower. In that case, low-temperature polysilicon or an oxide semiconductor can be used for the semiconductor layer, and mass production is possible with use of a conventional production line for low-temperature polysilicon. Also in that case, with use of the insulating layer and the transistor formed through the process at 500° C. or lower, insulating layers with an excellent gas barrier property formed at 500° C. or lower can be provided above and below the organic EL element. Accordingly, the entry of impurities such as moisture into the organic EL element or the semiconductor layer is suppressed, whereby a highly reliable light-emitting device can be obtained as compared with the case of using the organic resin or the like for the separation layer.

Alternatively, the insulating layer and the transistor can be formed over the formation substrate at 400° C. or lower. In that case, amorphous silicon or an oxide semiconductor can be used for the semiconductor layer, and mass production is possible with use of a conventional production line for amorphous silicon. Also in that case, with use of the insulating layer and the transistor formed through the process at 400° C. or lower, insulating layers with an excellent gas barrier property formed at 400° C. or lower can be provided above and below the organic EL element. Accordingly, the entry of impurities such as moisture into the organic EL element or the semiconductor layer can be suppressed, whereby a reliable light-emitting device can be obtained as compared with the case of using the organic resin or the like for the separation layer.

Figure 9C:
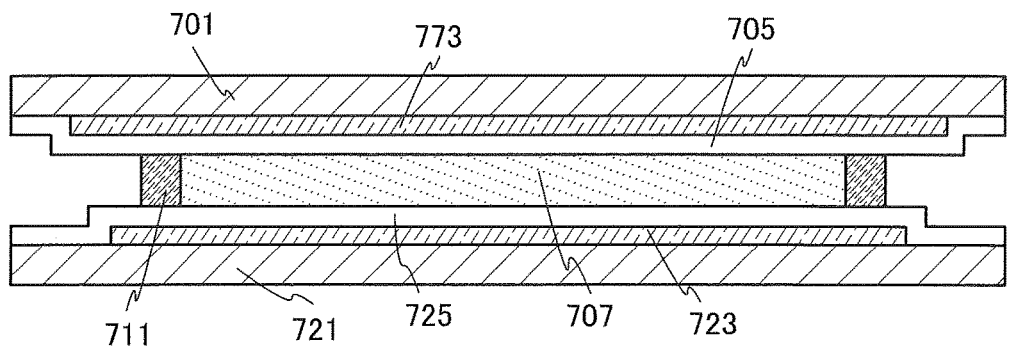

Next, the formation substrate 701 and the formation substrate 721 are attached to each other by using a bonding layer 707 and a frame-like bonding layer 711 so that the surfaces over which the layers to be separated are formed face each other, and then, the bonding layer 707 and the frame-like bonding layer 711 are cured (FIG. 9C). Here, the frame-like bonding layer 711 and the bonding layer 707 in a region surrounded by the frame-like bonding layer 711 are provided over the layer to be separated 725 and after that, the formation substrate 701 and the formation substrate 721 face each other and are attached to each other.

Note that the formation substrate 701 and the formation substrate 721 are preferably attached to each other in a reduced-pressure atmosphere.

Figure 9D:
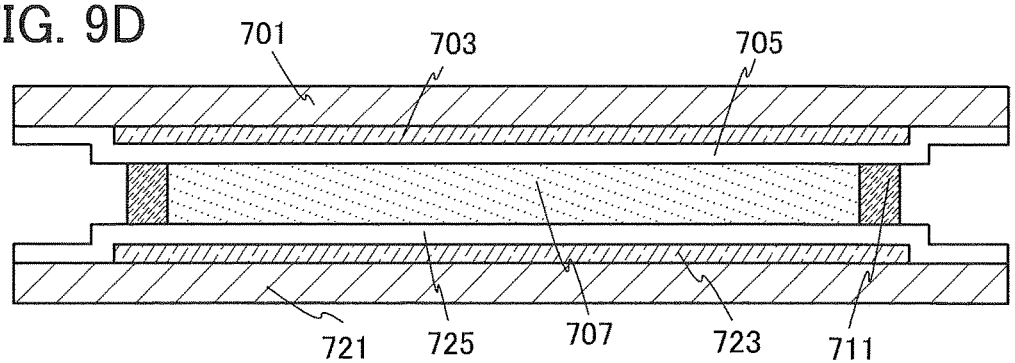

Note that although FIG. 9C illustrates the case where the separation layer 703 and the separation layer 723 are different in size, separation layers having the same size as illustrated in FIG. 9D may be used.

The bonding layer 707 is provided to overlap with the separation layer 703, the layer to be separated 705, the layer to be separated 725, and the separation layer 723. Edges of the bonding layer 707 are preferably positioned inside an area between at least edges of either the separation layer 703 or the separation layer 723 (the separation layer that is desirably separated from the substrate first). Accordingly, strong adhesion between the formation substrate 701 and the formation substrate 721 can be suppressed; thus, a decrease in the yield of a subsequent separating process can be suppressed.

Figure 10A:
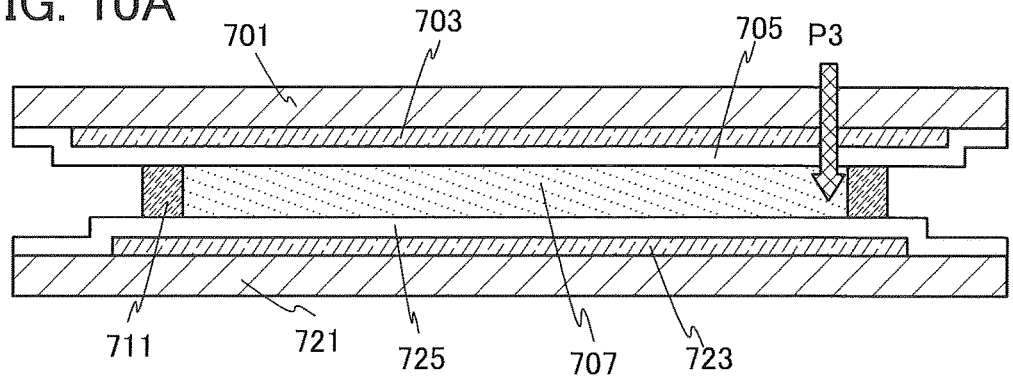
FIGS. 10A to 10D illustrate a method for manufacturing a foldable device of an embodiment.
Figure 10B:
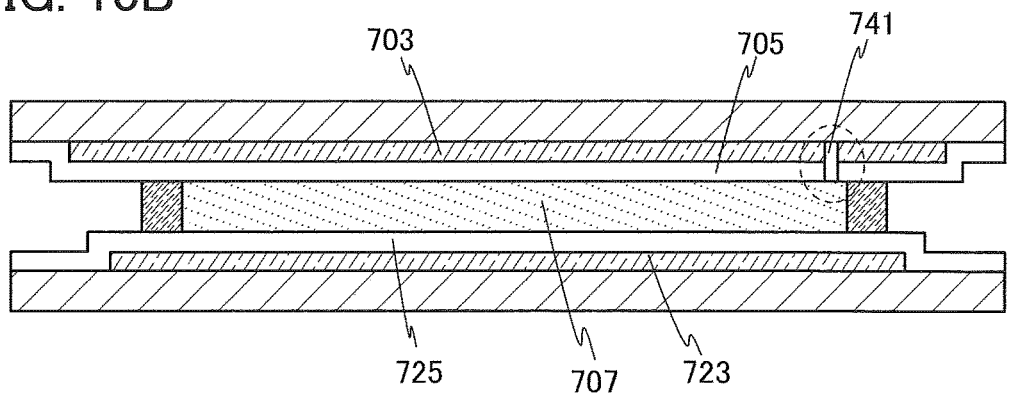

Next, a first trigger 741 for separation from the substrate is formed by laser irradiation (FIGS. 10A and 10B).

Either the formation substrate 701 or the formation substrate 721 may be separated first. In the case where the separation layers differ in size, a substrate over which a larger separation layer is formed may be separated first or a substrate over which a smaller separation layer is formed may be separated first. In the case where an element such as a semiconductor element, a light-emitting element, or a display element is formed over only one of the substrates, the substrate on which the element is formed may be separated first or the other substrate may be separated first. Here, an example in which the formation substrate 701 is separated first is described.

A region where the bonding layer 707 in a cured state or the frame-like bonding layer 711 in a cured state, the layer to be separated 705, and the separation layer 703 overlap with one another is irradiated with laser light. Here, the bonding layer 707 is in a cured state and the frame-like bonding layer 711 is not in a cured state, and the bonding layer 707 in a cured state is irradiated with laser light (see an arrow P3 in FIG. 10A).

Part of the layer to be separated 705 is removed; thus, the first trigger 741 for separation from the substrate can be formed (see a region surrounded by a dashed line in FIG. 10B). At this time, not only the layer to be separated 705 but also the separation layer 703, the bonding layer 707, or another layer included in the layer to be separated 705 may be partly removed.

It is preferred that laser light irradiation be performed from the side of the substrate provided with the separation layer that is desirably separated. In the case where a region where the separation layer 703 and the separation layer 723 overlap with each other is irradiated with laser light, the formation substrate 701 and the separation layer 703 can be selectively separated by cracking only the layer to be separated 705 of the layers to be separated 705 and 725 (see the region surrounded by the dotted line in FIG. 10B).

In the case where the region where the separation layer 703 and the separation layer 723 overlap with each other is irradiated with laser light, it might be difficult to selectively separate one of the formation substrates when a trigger for separation from the substrate is formed in both the layer to be separated 705 on the separation layer 703 side and the layer to be separated 725 on the separation layer 723 side. Therefore, laser light irradiation conditions are sometimes restricted so that only one of the layers to be separated is cracked. The method for forming the first trigger 741 for separation from the substrate is not limited to laser light irradiation, and the first trigger 741 may be formed by a sharp knife such as a cutter.

Figure 10C:
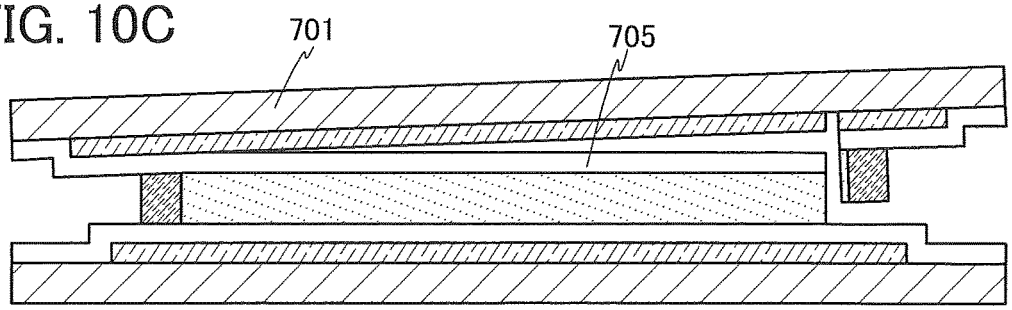
Figure 10D:
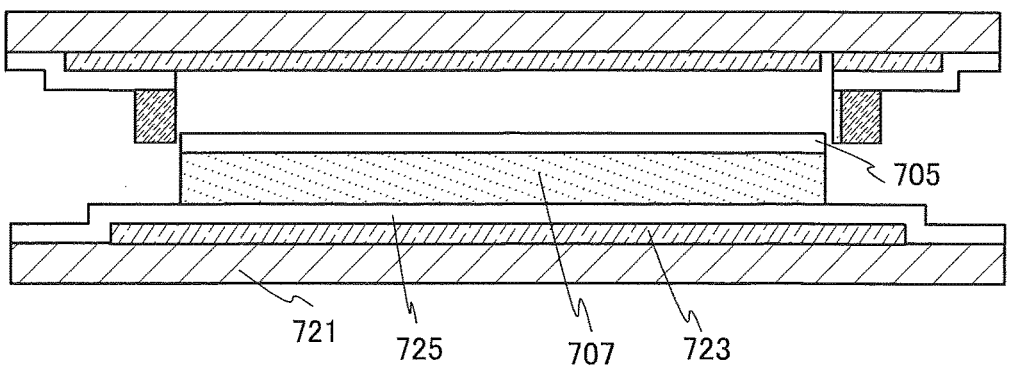

Then, the layer to be separated 705 and the formation substrate 701 are separated from each other from the first trigger 741 for separation from the substrate (FIGS. 10C and 10D). Consequently, the layer to be separated 705 can be transferred from the formation substrate 701 to the formation substrate 721.

Figure 11A:
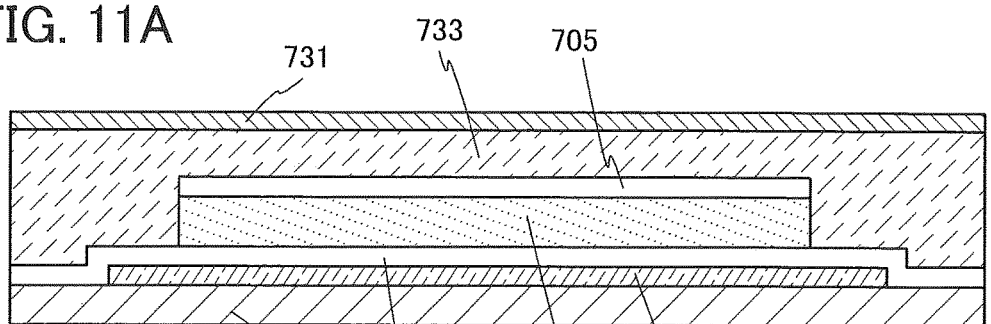
FIGS. 11A to 11D illustrate a method for manufacturing a foldable device of an embodiment.

The layer to be separated 705 that is separated from the formation substrate 701 in the step of FIG. 10D is attached to a substrate 731 with a bonding layer 733, and the bonding layer 733 is cured (FIG. 11A).

Figure 11B:
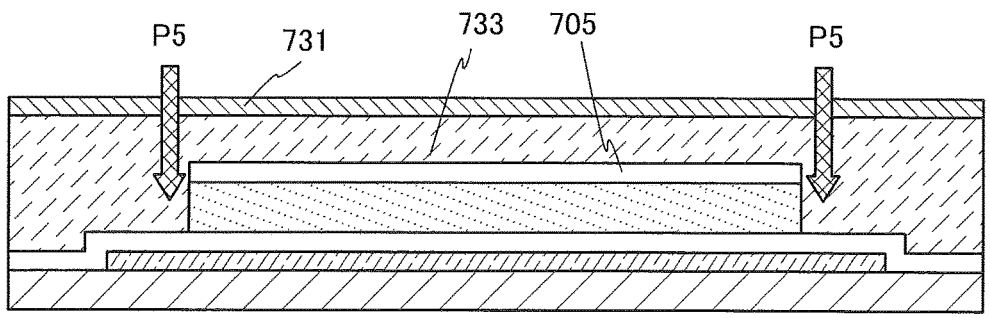
Figure 11C:
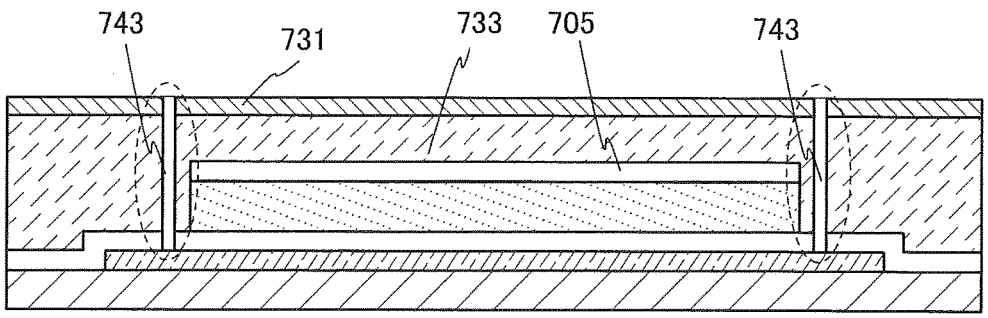
Figure 11D:
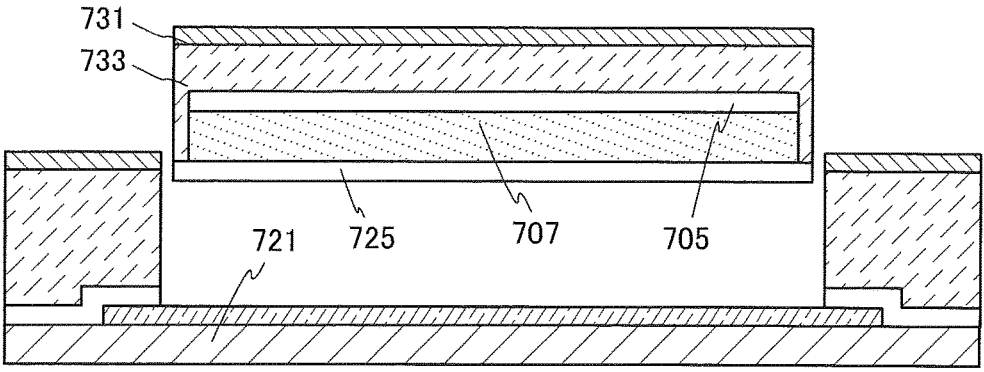

Next, a second trigger 743 for separation from the substrate is formed by a sharp knife such as a cutter (FIGS. 11B and 11C). The second trigger 743 for separation from the substrate may be formed not only by a sharp knife such as a cutter, but also by laser light irradiation or the like.

In the case where the substrate 731 on the side where the separation layer 723 is not provided can be cut by a knife or the like, a cut may be made in the substrate 731, the bonding layer 733, and the layer to be separated 725 (see arrows P5 in FIG. 11B). Consequently, part of the layer to be separated 725 can be removed; thus, the second trigger 743 for separation from the substrate can be formed (see a region surrounded by a dashed line in FIG. 11C).

In the case where there is a region in which the formation substrate 721 and the substrate 731 are attached to each other using the bonding layer 733 without overlapping with the separation layer 723 as illustrated in FIGS. 11B and 11C, the yield of a subsequent process of separation from the substrate might be decreased depending on the degree of adhesion between the formation substrate 721 and the substrate 731. Therefore, a cut is preferably made in a frame shape in a region where the bonding layer 733 in a cured state and the separation layer 723 overlap with each other to form the second trigger 743 for separation from the substrate in the form of a solid line. This can improve the yield of the process of separation from the substrate.

Then, the layer to be separated 725 and the formation substrate 721 are separated from each other from the second trigger 743 for separation from the substrate (FIG. 11D), so that the layer to be separated 725 can be transferred from the formation substrate 721 to the substrate 731.

For example, in the case where the tungsten oxide film that is tightly anchored by $N_2O$ plasma or the like is formed on an inorganic film such as a tungsten film, adhesion can be relatively high in deposition. After that, when a separation trigger is formed, cleavage occurs therefrom, whereby a layer to be separated can be easily separated from a formation substrate and transferred to another substrate.

The formation substrate 721 and the layer to be separated 725 may be separated from each other by filling the interface between the separation layer 723 and the layer to be separated 725 with a liquid such as water. A portion between the separation layer 723 and the layer to be separated 725 absorbs a liquid through a capillarity action. This can prevent static electricity caused at the time of separation from the substrate from adversely affecting the functional element such as an FET included in the layer to be separated 725 (e.g., damaging a semiconductor element).

When a bond of M-O—W (M represents a given element) is divided by application of physical force, a liquid is absorbed into the gap, whereby the bond becomes bonds of M-OH HO—W with a longer bond distance and the separation is promoted.

Note that a liquid may be sprayed in an atomized form or in a vaporized form. Examples of the liquid include pure water, an organic solvent, a neutral, alkali, or acid aqueous solution, and an aqueous solution in which a salt is dissolved.

The temperature of the liquid and the substrate at the time of dynamic separation is set in the range from room temperature to 120° C., and preferably set to 60° C. to 90° C.

In the method for separation from a substrate in one embodiment of the present invention described above, separation of the formation substrate is performed after the second trigger 743 for separation from the substrate is formed by a sharp knife or the like so that the separation layer and the layer to be separated are made in a separable state. This can improve the yield of the process of separation from the substrate.

In addition, bonding of a substrate with which a device is to be formed can be performed after the following procedure: a pair of formation substrates each provided with a layer to be separated are attached to each other and the formation substrates are individually separated. Therefore, formation substrates having low flexibility can be attached to each other when the layers to be separated are attached to each other, whereby alignment accuracy at the time of attachment can be improved compared with the case where flexible substrates are attached to each other.

In the method for separation from a substrate in one embodiment of the present invention, a layer to be separated over an oxide layer includes a first layer and a second layer from which hydrogen is released by heat treatment. In addition, $WO_3$ in the oxide layer can be reduced by hydrogen released by heat treatment from the layer to be separated, so that the oxide layer can have a high $WO_2$ content. Consequently, separation from the substrate can be facilitated.

This embodiment can be combined with any of the other embodiments in this specification as appropriate.

This application is based on Japanese Patent Application serial No. 2016-090875 filed with Japan Patent Office on Apr. 28, 2016, the entire contents of which are hereby incorporated by reference.

What is claimed is:

1. An semiconductor device comprising:
a first film;
a second film;
a panel substrate; and
a first housing,
wherein the first housing includes a first slit,
wherein the panel substrate includes a region interposed between the first film and the second film,
wherein the first slit is configured to store the region,
wherein one or more of the panel substrate, the first film, and the second film is configured to slide along the first slit,
wherein the first film is closer to an end portion of the slit than the second film is when the semiconductor device is being folded so that the panel substrate has a depression, and
wherein the second film is closer to the end portion of the slit than the first film is when the semiconductor device is being folded so that the panel substrate has a projection.

2. The semiconductor device according to claim 1,
wherein the panel substrate has flexibility and includes a display region,
wherein the second film includes a region interposed between the display region and the first housing,
wherein the first film has visible light transmittance and flexibility, and
wherein the second film has flexibility.

3. The semiconductor device according to claim 2,
wherein the first film is fixed to part of the first housing.

4. The semiconductor device according to claim 2, further comprising a circuit board,
wherein the circuit board is connected to the panel substrate, and
wherein the circuit board is stored in the first housing.

5. The semiconductor device according to claim 2,
wherein at least one driver circuit is provided in a region over the panel substrate by a COG method,
wherein a curved portion is provided between the display region and the region provided by the COG method, and
wherein the panel substrate is folded at the curved portion.

6. The semiconductor device according to claim 2,
wherein the panel substrate includes an image signal line driver circuit,
wherein a curved portion is provided between the image signal line driver circuit and the display region, and
wherein the panel substrate is folded at the curved portion.

7. The semiconductor device according to claim 2,
wherein the panel substrate is a touch panel, and
wherein an FPC that transmits or receives a signal for controlling the display region, and an FPC that transmits or receives a signal for controlling the touch panel are stored in the first housing.

8. The semiconductor device according to claim 1,
wherein the panel substrate is a touch panel.

9. The semiconductor device according to claim 1,
wherein two or more of the panel substrate, the first film, and the second film substantially align with each other in the first slit when folded, and
wherein the two or more of the panel substrate, the first film, and the second film substantially align with each other in the first slit when opened.

10. The semiconductor device according to claim 1,
wherein a second housing is in contact with the second film but not with the first film.

11. The semiconductor device according to claim 1,
wherein a first region of the first slit faces a second region of the first slit.

12. The semiconductor device according to claim 1,
wherein the semiconductor device is an information processing device.

13. An semiconductor device comprising:
a first housing;
a second housing;
a third housing;
a first hinge;
a second hinge;
a first slit;
a second slit;
a third slit;
a panel substrate;
a first film; and
a second film,
wherein the first hinge includes a first axis and the second hinge includes a second axis,
wherein the second axis is arranged parallel to the first axis,
wherein the second housing is connected to the first housing through the first hinge so as to be rotatable around the first axis,
wherein the third housing is connected to the second housing through the second hinge so as to be rotatable around the second axis,
wherein the first housing includes the first slit,
wherein the second housing includes the second slit,
wherein the third housing includes the third slit,
wherein the panel substrate includes a region interposed between the first film and the second film,
wherein one or more of the first slit, the second slit, and the third slit is configured to store the region,
wherein one or more of the panel substrate, the first film, and the second film can slide along the third slit,
wherein the panel substrate has flexibility and includes a display region,
wherein the first housing includes a first part and a second part overlapping with a periphery of the first part,
wherein the second film is interposed between the display region and the first part,
wherein the first film has visible light transmittance and flexibility,
wherein the second film has flexibility,
wherein the first film is fixed to the first housing,
wherein the first film can slide along the second slit and the third slit when the first housing and the second housing rotate around the first axis, and
wherein the second film is fixed to the first housing, the second housing, and the third housing.

14. The semiconductor device according to claim 13,
wherein the third housing includes an end portion parallel to the second hinge, and
wherein a distance between the first film and the end portion, a distance between the second film and the end portion, and a distance between the panel substrate and the end portion are each greater than 0 when each of the first film, the second film, and the panel substrate slides in the third slit.

15. The semiconductor device according to claim 13, wherein the first film is closer to an end portion of the slit than the second film is when the semiconductor device is being folded so that the panel substrate has a depression, and wherein the second film is closer to the end portion of the slit than the first film is when the semiconductor device is being folded so that the panel substrate has a projection.

16. The semiconductor device according to claim 13, wherein two or more of the panel substrate, the first film, and the second film substantially align with each other in the first slit when folded, and wherein the two or more of the panel substrate, the first film, and the second film substantially align with each other in the first slit when opened.

17. The semiconductor device according to claim 13, wherein the semiconductor device is an information processing device.

\* \* \* \* \*